(12) United States Patent
Sakaguchi

(10) Patent No.: US 8,896,016 B2
(45) Date of Patent: Nov. 25, 2014

(54) LED LIGHTING MODULE AND METHOD OF MAKING THE SAME

(71) Applicant: Rohm Co., Ltd., Kyoto-shi, Kyoto (JP)

(72) Inventor: Hiroyoshi Sakaguchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/895,665

(22) Filed: May 16, 2013

(65) Prior Publication Data

US 2013/0306999 A1 Nov. 21, 2013

(30) Foreign Application Priority Data

May 16, 2012 (JP) .................................. 2012-112174
May 10, 2013 (JP) .................................. 2013-100223

(51) Int. Cl.
| | |
|---|---|
| H01L 33/48 | (2010.01) |
| H01L 33/62 | (2010.01) |
| H01L 33/64 | (2010.01) |
| H01L 27/15 | (2006.01) |
| H01L 33/60 | (2010.01) |

(52) U.S. Cl.
CPC ....... *H01L 33/62* (2013.01); *H01L 2224/73265* (2013.01); *H01L 2224/48465* (2013.01); *H01L 33/642* (2013.01); *H01L 33/60* (2013.01); *H01L 27/15* (2013.01)
USPC ................. 257/99; 257/89; 257/98; 438/26

(58) Field of Classification Search
USPC ............................................... 438/22, 26, 27
See application file for complete search history.

(56) References Cited

U.S. PATENT DOCUMENTS

| | | | |
|---|---|---|---|
| 7,690,817 B2* | 4/2010 | Sanpei et al. ................ | 362/294 |
| 2003/0189830 A1* | 10/2003 | Sugimoto et al. ............ | 362/294 |
| 2009/0250709 A1* | 10/2009 | Chang et al. .................. | 257/88 |
| 2011/0272731 A1* | 11/2011 | Suzuki et al. ................. | 257/99 |

FOREIGN PATENT DOCUMENTS

JP 2007-208150 8/2007

* cited by examiner

*Primary Examiner* — Matthew W Such
*Assistant Examiner* — Scott Stowe
(74) *Attorney, Agent, or Firm* — Hamre, Schumann, Mueller & Larson, P.C.

(57) ABSTRACT

An LED lighting module includes a substrate and an LED chip mounted on the substrate. The substrate includes a base made of metal and an insulating layer. The base includes a principal surface and a raised portion above the principal surface. The insulating layer covers the principal surface of the base and exposes at least a part of the raised portion. The LED chip is supported on the raised portion.

27 Claims, 24 Drawing Sheets

LED LIGHTING MODULE AND METHOD OF MAKING THE SAME

BACKGROUND OF THE INVENTION

1. Field of the Invention

The present invention relates to an LED lighting module and a method of making an LED lighting module.

2. Description of the Related Art

FIG. 24 shows an example of conventional LED lighting module. The LED lighting module 900 shown in the figure includes a substrate 91, an LED chip 95, a sub-mount substrate 96, a case 97 and a sealing resin 99. The LED lighting module 900 may be used in various applications, such as a point light source of an electronic device when structured as a relatively small module, an elongated bar-like light source when provided with a plurality of LED chips 95 arranged on an elongated substrate 91, and a surface light source when provided with a plurality of LED chips 95 arranged in a matrix on a substrate 91.

The substrate 91 is made up of a base 92, an insulating layer 93 and a wiring layer 94. The base 92 is a metal plate made of e.g. aluminum. The insulating layer 93 is made of e.g. an insulating resin and covers the upper surface of the base 92 in the figure. The wiring layer 94 is provided on the insulating layer 93 and constitutes an electrical connection path to the LED chip 95. The LED chip 95 is made up of a plurality of semiconductor layers formed one on top of another, and mounted on the sub-mount substrate 96. The LED chip 95 and the wiring layer 94 are connected to each other via a wire. The sub-mount substrate 96 is made of e.g. Si and bonded to the insulating layer 93. The case 97 surrounds the LED chip 95 and has a reflective surface 98. The sealing resin 99 covers the LED chip 95.

To enhance the brightness of the LED lighting module 900, effective heat dissipation from the LED chip 95 to the base 92 needs to be realized. However, the insulating layer 93 is disposed between the LED chip 95 and the base 92. The insulating layer 93, which needs to have insulating properties, generally has a lower thermal conductivity than e.g. metal. Thus, heat dissipation from the LED chip 95 has been insufficient.

SUMMARY OF THE INVENTION

The present invention has been proposed in view of the foregoing situation. It is therefore an object of the present invention to provide an LED lighting module capable of enhancing the brightness, and a method of making such an LED lighting module.

According to a first aspect of the present invention, there is provided an LED lighting module comprising a substrate including a base which is made of metal and which includes a principal surface and a raised portion raised above the principal surface, and the substrate also includes an insulating layer covering the principal surface of the base and exposing at least a part of the raised portion. An LED chip is supported on the raised portion.

In a preferred embodiment of the present invention, the substrate includes a wiring layer formed on the insulating layer.

In a preferred embodiment of the present invention, the raised portion includes: a top surface parallel to the principal surface; and an inclined surface connecting the top surface and the principal surface to each other.

In a preferred embodiment of the present invention, the insulating layer exposes the top surface of the raised portion.

In a preferred embodiment of the present invention, the base includes a recessed portion which is on the opposite side from the raised portion in the thickness direction and which overlaps the raised portion as viewed in the thickness direction.

In a preferred embodiment of the present invention, the recessed portion has a bottom surface parallel to the principal surface.

In a preferred embodiment of the present invention, the bottom surface is inside the raised portion as viewed in the thickness direction.

In a preferred embodiment of the present invention, the LED chip is bonded to the raised portion via a metal bonding layer.

In a preferred embodiment of the present invention, the substrate includes a base plating layer disposed between the metal bonding layer and the top surface.

In a preferred embodiment of the present invention, the base plating layer comprises a plurality of layers and the top layer of the plurality of layers is made of Au.

In a preferred embodiment of the present invention, the metal bonding layer is a eutectic bonding layer of Sn and Au.

In a preferred embodiment of the present invention, the wiring layer includes a base layer formed on the insulating layer, and a wiring plating layer covering the base layer.

In a preferred embodiment of the present invention, the wiring plating layer has the same multi-layer laminated structure as that of the base plating layer.

In a preferred embodiment of the present invention, the LED lighting module further comprises a sub-mount substrate disposed between the raised portion and the LED chip.

In a preferred embodiment of the present invention, the LED lighting module further comprises a reflective resin which exposes a surface of the sub-mount substrate on which the LED chip is mounted, and the reflective resin covers at least a part of each of the wiring layer and the insulating layer.

In a preferred embodiment of the present invention, the LED lighting module further comprises a case including a reflective surface surrounding the LED chip, and the reflective resin covers a region extending from the sub-mount substrate to the reflective surface.

In a preferred embodiment of the present invention, in the direction in which the principal surface faces, the top surface of the raised portion is farther away from the principal surface than the wiring layer is. The LED lighting module further comprises a reflective resin exposing the base plating layer and covering at least a part of each of the wiring layer and the insulating layer.

In a preferred embodiment of the present invention, the LED lighting module further comprises a case including a reflective surface surrounding the LED chip. The reflective resin covers a region extending from the base plating layer to the reflective surface.

In a preferred embodiment of the present invention, the LED lighting module further comprises a case including a reflective surface surrounding the LED chip. In an internal space surrounded by the reflective surface of the case are arranged the LED chip and at least one additional LED chip that emits light of a different wavelength from light emitted from the LED chip. The additional LED chip is mounted at a position avoiding the raised portion.

In a preferred embodiment of the present invention, the LED lighting module further comprises a sealing resin collectively covering the LED chip and the additional LED chip and containing a fluorescent substance that emits light of a different wavelength from light emitted from the LED chip when excited by the light from the LED chip.

In a preferred embodiment of the present invention, the LED chip emits blue light, the additional LED chip emits red light, and the sealing resin emits green light when excited by blue light emitted from the LED chip.

In a preferred embodiment of the present invention, the LED lighting module further comprises a case including a reflective surface surrounding the LED chip. The case includes two internal spaces surrounded by the reflective surface. The LED chip and the raised portion are arranged in one of the internal spaces, and at least one additional LED chip that emits light of a different wavelength from light emitted from the LED chip is arranged in the other one of the internal spaces.

In a preferred embodiment of the present invention, the LED lighting module further comprises a first sealing resin covering the LED chip and an additional sealing resin covering the additional LED chip. The first sealing resin contains a fluorescent substance that emits light of a different wavelength from light emitted from the LED chip when excited by the light from the LED chip.

In a preferred embodiment of the present invention, the LED chip emits blue light, the additional LED chip emits red light, the first sealing resin emits green light when excited by blue light emitted from the LED chip and the additional sealing resin is transparent.

According to a second aspect of the present invention, there is provided an LED lighting module comprising a substrate including: a base which is made of metal and which includes a principal surface; and an insulating layer covering the principal surface of the base and including an opening exposing at least a part of the principal surface. An LED chip is supported on the principal surface at a portion exposed through the opening.

In a preferred embodiment of the present invention, the LED lighting module further comprising a sub-mount substrate disposed between the LED chip and the principal surface.

According to a second aspect of the present invention, there is provided an LED lighting module comprising: a substrate including a base which is made of metal and which includes a principal surface, an insulating layer covering the principal surface of the base, and a wiring extending on the insulating layer; a seat portion including an upper surface that is offset from the principal surface and the insulating layer of the substrate in a direction normal to the principal surface; an LED chip supported on the upper surface of the seat portion; a case including a reflective surface surrounding the LED chip; a reflective resin which covers the insulating layer, a side surface of the seat portion and the wiring and which reflects light emitted from the LED chip; and a sealing resin filled in the case and containing a fluorescent substance which is made of a sulfide and which emits light of a different wavelength from light emitted from the LED chip when excited by the light from the LED chip.

In a preferred embodiment of the present invention, the seat portion comprises a raised portion of the substrate raised above the principal surface. At least a part of the raised portion is exposed from the insulating layer. The LED chip is supported on the raised portion.

In a preferred embodiment of the present invention, the reflective resin and the case provide a bonding portion therebetween, and the bonding portion includes an extremity farthest away from the principal surface of the base. The extremity is farther away from the principal surface than any portion of the seat portion is.

In a preferred embodiment of the present invention, the reflective resin and the case provide a bonding portion therebetween, and the bonding portion includes an extremity farthest away from the principal surface of the base. The extremity is farther from the principal surface than any portion of the LED chip is.

According to a fourth aspect of the present invention, there is provided a method of making an LED lighting module. The method comprises the steps of: preparing a metal plate including a principal surface and a reverse surface facing away from each other in a thickness direction; forming an insulating layer covering the principal surface; forming a raised portion raised above the principal surface and a recessed portion recessed from the reverse surface by moving a part of the metal plate in a direction from the reverse surface toward the principal surface; expose at least a part of the raised portion by removing a part of the insulating layer; and mounting the LED chip on the raised portion.

In a preferred embodiment of the present invention, the step of forming the raised portion and the recessed portion comprises forming a top surface in the raised portion such that the top surface is parallel to the principal surface. The step of exposing at least a part of the raised portion comprises preparing a removal tool with an edge extending along the top surface, and working the removal too in such a manner that the edge moves along the top surface, thereby removing only a portion of the insulating layer which covers the top surface.

In a preferred embodiment of the present invention, the method of making an LED lighting module further comprises the step of forming a base plating layer covering the top surface. The forming of the base plating layer is performed after the step of exposing at least a part of the raised portion and before the step of mounting the LED chip on the raised portion.

In a preferred embodiment of the present invention, the method of making an LED lighting module further comprises the step of forming a base layer made of metal on the insulating layer after the step of forming the insulating layer. In the step of forming the base plating layer, a wiring plating layer covering the base layer is formed collectively.

According to the above-described structure, the LED chip is supported on the raised portion without the intervention of the insulating layer. Thus, heat transfer from the LED chip is not hindered by the insulating layer. Thus, effective heat dissipation from the LED chip is realized, and brightness of the LED lighting module can be increased.

Other features and advantages of the present invention will become more apparent from detailed description given below with reference to the accompanying drawings.

DESCRIPTION OF THE PREFERRED EMBODIMENTS

Figure 1:
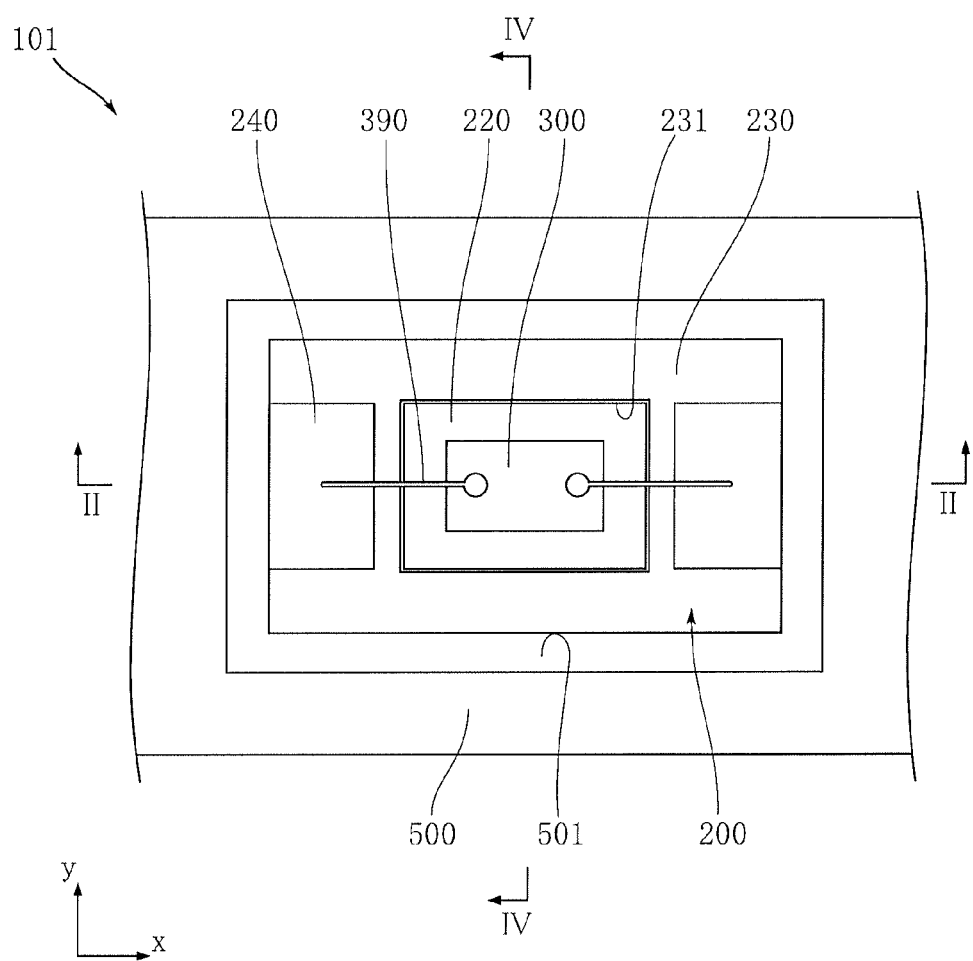
FIG. 1 is a schematic plan view showing an LED lighting module according to a first embodiment of the present invention.
Figure 2:
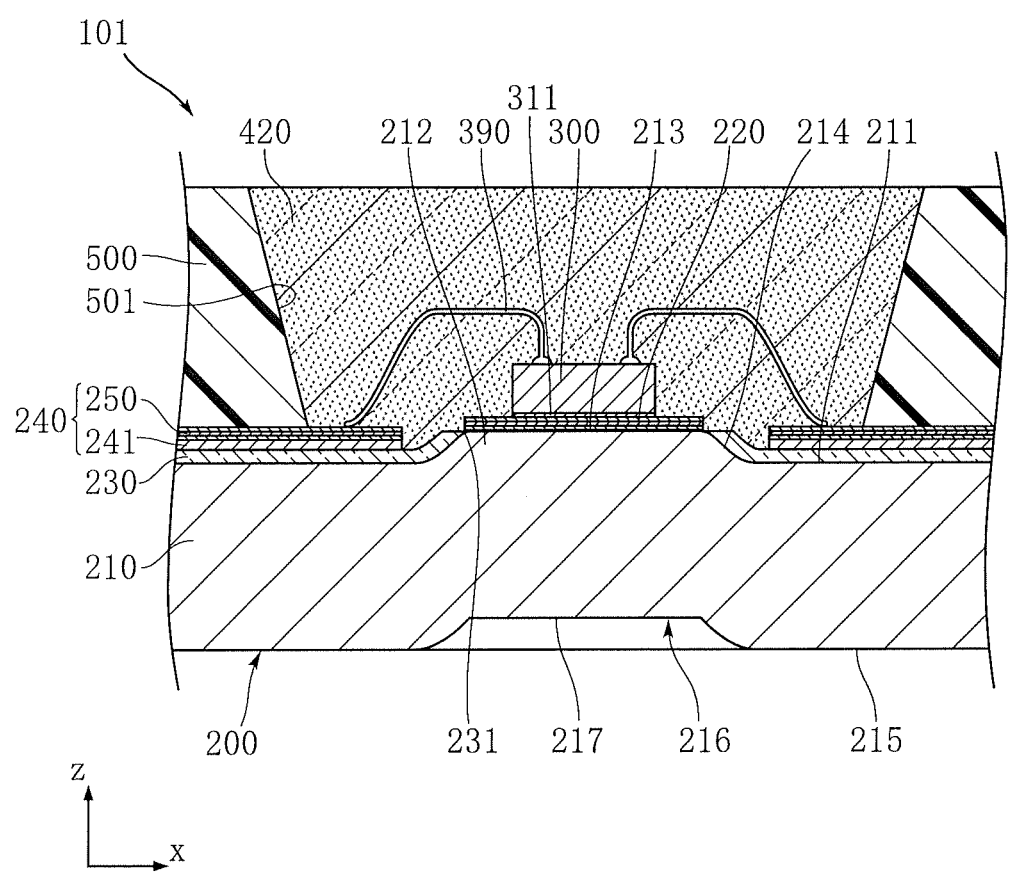
FIG. 2 is a schematic sectional view taken along lines II-II in FIG. 1.

Preferred embodiments of the present invention are described below with reference to the accompanying drawings.

FIGS. 1-4 show an LED lighting module according to a first embodiment of the present invention. The LED lighting module 101 of this embodiment includes a substrate 200, an LED (light emitting diode) chip 300, a sealing resin 420 and a case 500. The LED lighting module 101 is structured as a relatively small module. Thus, the LED lighting module can be used as a point light source of an electronic device, as an elongated bar-like light source by arranging a plurality of LED chips 300 on an elongated substrate 200, or as a surface light source by arranging a plurality of LED chips 300 in a matrix on a substrate 200. In an example of use as a bar-like light source, the LED lighting module 101 is arranged to face a side surface of a light guide plate in the form of a flat plate so that light is emitted from the light guide plate as planar light. The planar light is caused to pass through a liquid crystal panel arranged on the light guide plate, whereby the LED lighting module 101 functions as the light source of a liquid crystal display. In an example of use as a surface light source, the LED lighting module 101 is arranged to overlap a liquid crystal panel so that the LED lighting module functions as the backlight of a liquid crystal display. These are merely examples of use, and the LED lighting module 101 of the present invention can be used for various purposes in various manners.

The substrate 200 is made up of a base 210, a plating layer 220, an insulating layer 230 and a wiring layer 240. The plating layer 220 corresponds to a base plating layer of the present invention.

The base 210 is a metal plate spreading in the x direction and the y direction and made of e.g. Al, Cu or Fe. In this embodiment, Al is selected as the material for the base 210, and the thickness of the base 210 is e.g. about 1.0-1.5 mm. The base 210 has a principal surface 211 and a reverse surface 215. The principal surface 211 and the reverse surface 215 face away from each other in the z direction. The base 210 has a raised portion 212 and a recessed portion 216.

The raised portion 212 is raised above the principal surface 211 in the z direction, and includes a top surface 213 and an inclined surface 214 in this embodiment. The top surface 213 is an obverse surface of a portion of the raised portion 212 which is highest upward in the z direction and parallel to the principal surface 211. In this embodiment, the top surface 213 is rectangular. The inclined surface 214 is connected to the principal surface 211 and the top surface 213 and inclined relative to the xy plane. The height of the raised portion 212 from the principal surface 211 is e.g. 150-200 μm. The raised portion 212 is an example of seat portion of the present invention. The top surface 213 of the raised portion 212 of the principal surface 211 corresponds to the upper surface of the present invention.

The recessed portion 216 is recessed above the reverse surface 215 in the z direction and overlaps the raised portion 212 as viewed in the z direction. In this embodiment, the recessed portion 216 has a bottom surface 217. The bottom surface 217 is parallel to the reverse surface 215 and rectangular in this embodiment. As viewed in the z direction, the bottom surface 217 is inside the raised portion 212. As viewed in the z direction, the edge of the bottom surface 217 and the edge of the top surface 213 generally overlap each other or the edge of the bottom surface 217 is slightly inward of the edge of the top surface 213. The depth of the recessed portion 216 from the reverse surface 215 is e.g. 150-200 μm.

Figure 3:
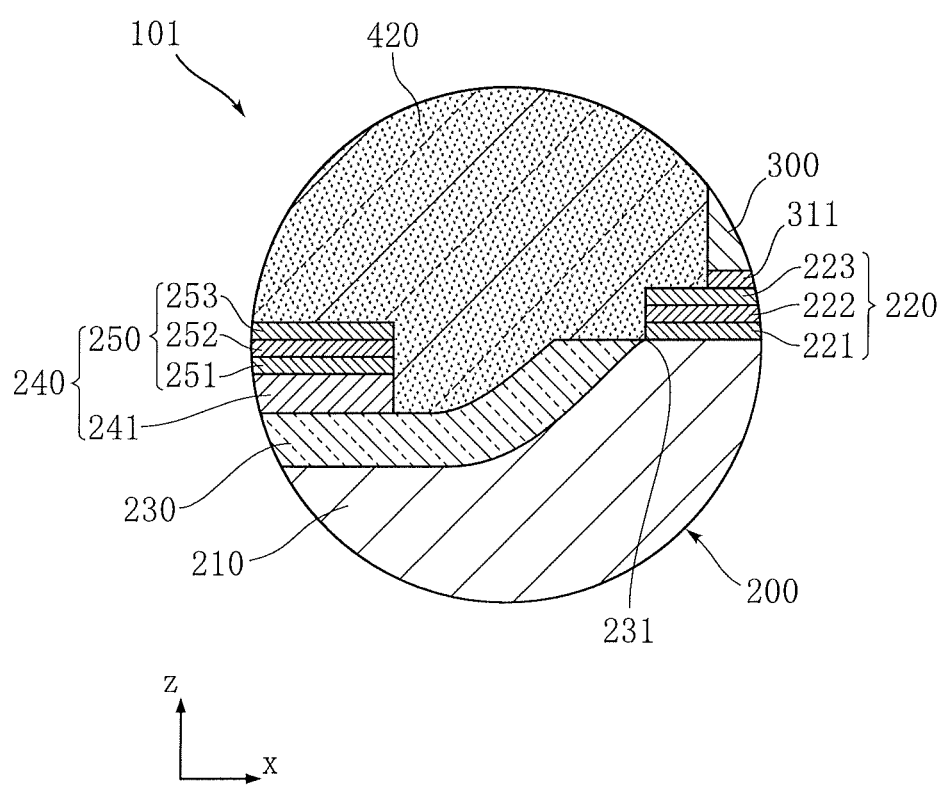
FIG. 3 is a schematic enlarged sectional view of the LED lighting module of FIG. 1.
Figure 4:
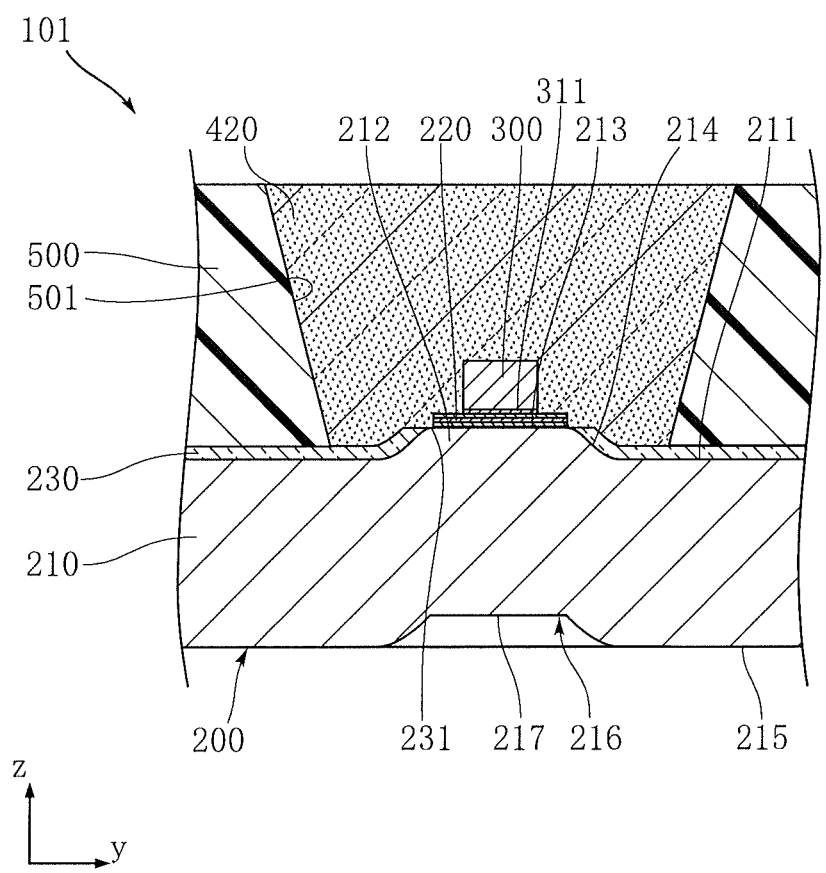
FIG. 4 is a schematic sectional view taken along lines IV-IV in FIG. 1.

The plating layer 220 covers the top surface 213 of the raised portion 212 and is made of a metal such as Cu, Ni, Pd or Au. As shown in FIG. 3, in this embodiment, the plating layer is made up of an Ni layer 221, a Pd layer 222 and an Au layer 223. The Ni layer 221 is formed directly on the top surface 213 and has a thickness of e.g. about 5 μm. The Pd layer 222 is formed on the Ni layer 221 and has a thickness of e.g. about 0.1 μm. The Au layer 223 is formed on the Pd layer 222 and has a thickness of e.g. about 0.1 μm. The LED chip 300 is bonded on the plating layer 220.

The insulating layer 230 covers the principal surface 211 of the base 210 and is made of an insulating resin or an insulating material such as $SiO_2$. The insulating layer 230 has an opening 231. The opening 231 is provided to expose at least a part of the raised portion 212, and in this embodiment, exposes the top surface 213 of the raised portion 212. The inclined surface 214 of the raised portion 212 is covered by the insulating layer 230. The thickness of the insulating layer 230 is e.g. about 100 μm.

The wiring layer 240 provides an electrical connection path to the LED chip 300 and is made of a metal such as Cu, Ni, Pd or Au. The wiring layer 240 is formed on the insulating layer 230, and in this embodiment, formed on the insulating layer 230 at a flat portion that covers the principal surface 211. As shown in FIG. 3, in this embodiment, the wiring layer 240 includes a base layer 241 and a plating layer 250. The base layer 241 is formed on the insulating layer 230 and made of e.g. Cu. The thickness of the base layer 241 is e.g. about 35 μm. The plating layer 250 is formed on the base layer 241 and made up of an Ni layer 251, a Pd layer 252 and an Au layer 253. The plating layer 250 corresponds to the wiring plating layer of the present invention. The Ni layer 251 is formed on the base layer 241 and has a thickness of e.g. about 5 μm. The Pd layer 252 is formed on the Ni layer 251 and has thickness of e.g. about 0.1 μm. The Au layer 253 is formed on the Pd layer 252 and has a thickness of about e.g. 0.1 μm. In this embodiment, as will be described later, the plating layer 250 of the wiring layer 240 and the plating layer 220 of the substrate 200 are made collectively by a single step.

The LED chip 300 is made of e.g. GaN-based semiconductor and emits blue light. The LED chip 300 of this embodiment is structured as a so-called two-wire type, but the present invention is not limited to this. The LED chip 300 is bonded to the Au layer 223 of the plating layer 220 of the substrate 200 via a metal bonding layer 311. The metal bonding layer 311 is formed by eutectic bonding between the Sn layer formed on the lower surface of the LED chip 300 and a part of the Au layer 223. The LED chip 300 is connected to the wiring layer 240 via two wires 390. The wire 390 is made of e.g. Au. The LED chip 300 may emit light other than blue light, such as ultraviolet light, green light or red light. The lower surface of the LED chip is bonded to the plating layer 220 by a conductive layer. Thus, a two-wire type is also preferable for these colors, where the term "two-wire type" refers to chips provided with an anode electrode and a cathode electrode on their upper surfaces and no electrodes on their lower surfaces.

The sealing resin 420 covers the LED chip 300 and comprises e.g. a transparent resin in which a fluorescent substance is mixed. For instance, as the fluorescent substance, use may be made of a substance that emits yellow light when excited by blue light from the LED chip 300. Alternatively, as the fluorescent substance, use may be made of a mixture of a substance that emits red light and a substance that emits green light when excited by blue light from the LED chip 300.

The case 500 is provided on the substrate 200 in such a manner as to surround the LED chip 300 and is made of e.g. a white resin. The case 500 includes a reflective surface 501. The reflective surface 501 is inclined with respect to the z direction and reflects the light emitted from the LED chip 300 in the x direction and in the y direction to direct the light upward in the z direction.

An example of a method of making the LED lighting module 101 is described below with reference to FIGS. 5-9.

Figure 5:
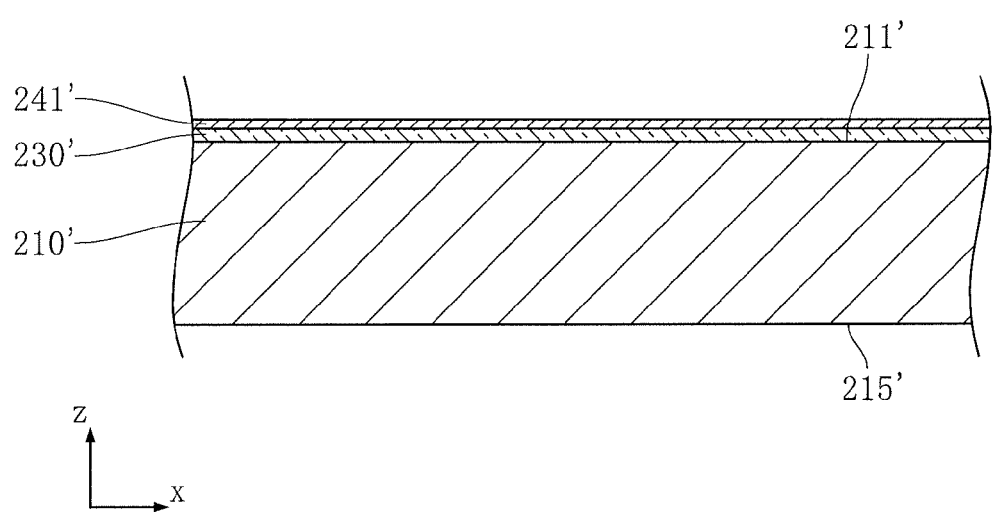
FIG. 5 is a schematic sectional view showing an example of a method of making the LED lighting module of FIG. 1.

First, as shown in FIG. 5, a metal plate 210' is prepared. For instance, the metal plate 210' is made of Al, Cu or Fe. In this embodiment, Al is selected as the material for the metal plate 210'. The thickness of the metal plate 210' is e.g. about 1.0-1.5 mm. The metal plate 210' has a principal surface 211' and a reverse surface 215' that face away from each other in the z direction. Then, an insulating layer 230' is formed to cover the principal surface 211'. The insulating layer 230' is made of an insulating resin or an insulating material such as $SiO_2$. The thickness of the insulating layer 230' is e.g. about 100 μm. Then, a metal layer 241' is formed to cover the insulating layer 230'. The formation of the metal layer 241' is performed by forming a Cu plating layer on the insulating layer 230' by electroless plating. The thickness of the metal layer 241' is e.g. about 35 μm.

Figure 6:
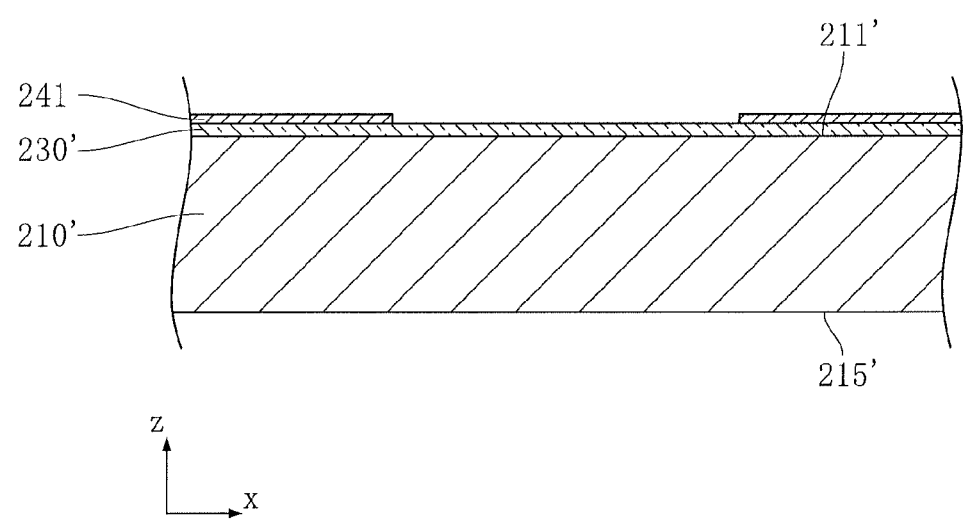
FIG. 6 is a schematic sectional view showing an example of a method of making the LED lighting module of FIG. 1.
Figure 7:
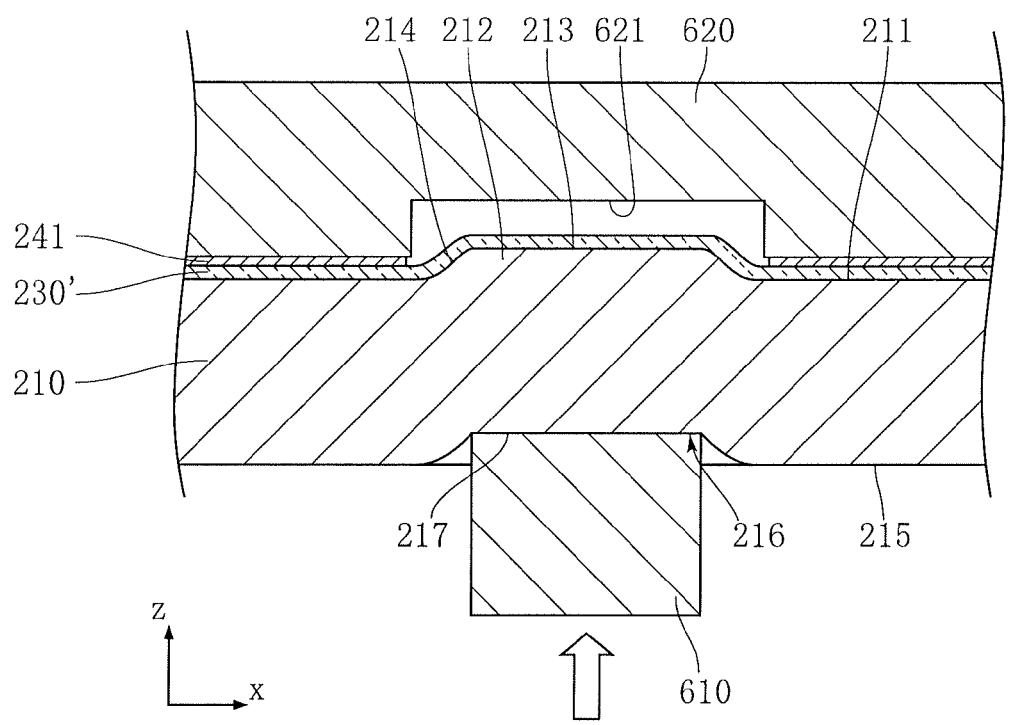
FIG. 7 is a schematic sectional view showing an example of a method of making the LED lighting module of FIG. 1.

Then, by patterning the metal layer 241' by e.g. etching, a base layer 241 is formed, as shown in FIG. 6. Then, as shown in FIG. 7, the metal plate 210' is worked by using mold members 610 and 620. The mold member 610 has a rectangular upper surface. The mold member 620 has a rectangular recess 621. As viewed in the z direction, the recess 621 is slightly larger than the upper surface of the mold member 610. The mold member 610 is arranged on the reverse surface 215' side of the metal plate 210', whereas the mold member 620 is arranged on the principal surface 211' side of the metal plate 210'. Then, the mold member 610 and the mold member 620 are brought closer to each other, so that the upper surface of the mold member 610 sinks into the metal plate 210'. Thus, a base 210 having a raised portion 212 and a recessed portion 216 is obtained. The portion which the upper surface of the mold member 610 has been in contact with becomes the bottom surface 217 of the recessed portion 216. The surface of the portion which entered the recess 621 of the mold member 620 correspondingly to the mold member 610 becomes the top surface 213. In the above-described process, in this embodiment, the base layer 241 comes into contact with a portion of the mold member 620 while avoiding the recess 621, so that the base layer is not deformed. The insulating layer 230' is deformed into a shape conforming to the raised portion 212.

Figure 8:
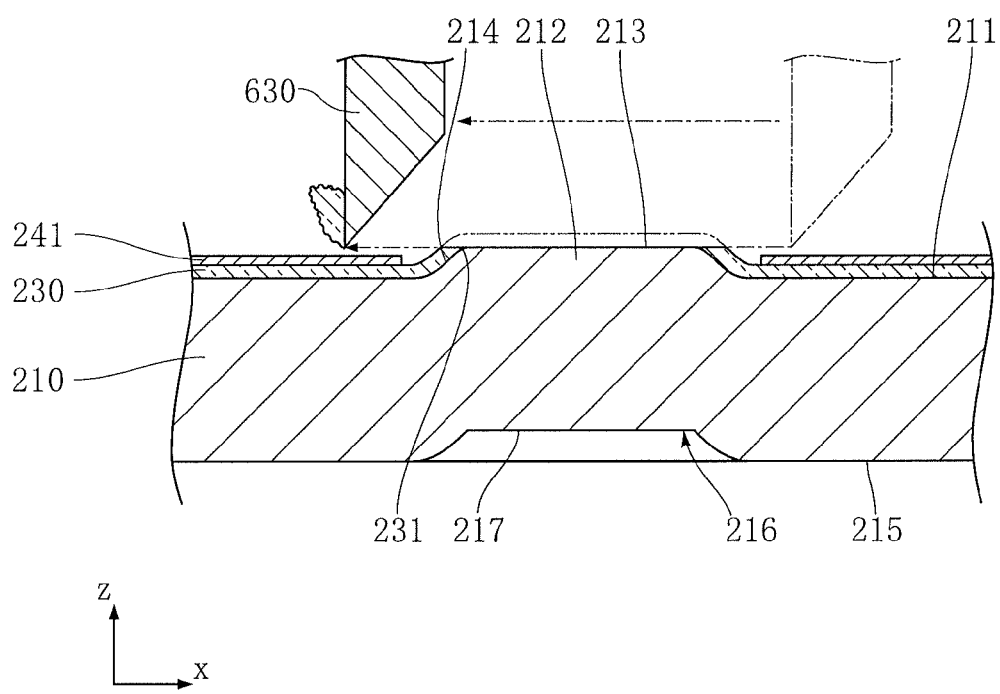
FIG. 8 is a schematic sectional view showing an example of a method of making the LED lighting module of FIG. 1.

Then, a part of the insulating layer 230' is removed, whereby the insulating layer 230 shown in FIG. 8 is obtained. For instance, the removal of a part of the insulating layer 230' is performed with a squeegee 630. The squeegee 630 corresponds to the removal tool of the present invention, and the squeegee 630 has a lower edge elongated in parallel to the y direction. The squeeze 630 is moved in the x direction, with the lower edge of squeegee 630 positioned at the same height as or slightly below the top surface 213. By this process, the portion of the insulating layer 230' which is positioned above the top surface 213 in the z direction is removed by the squeegee 630. As a result, the insulating layer 230 having an opening 231 that exposes only the top surface 213 is obtained. In this embodiment, the base layer 241 is positioned sufficiently lower than the top surface 213 in the z direction, so that it does not come into contact with the squeegee 630.

Figure 9:
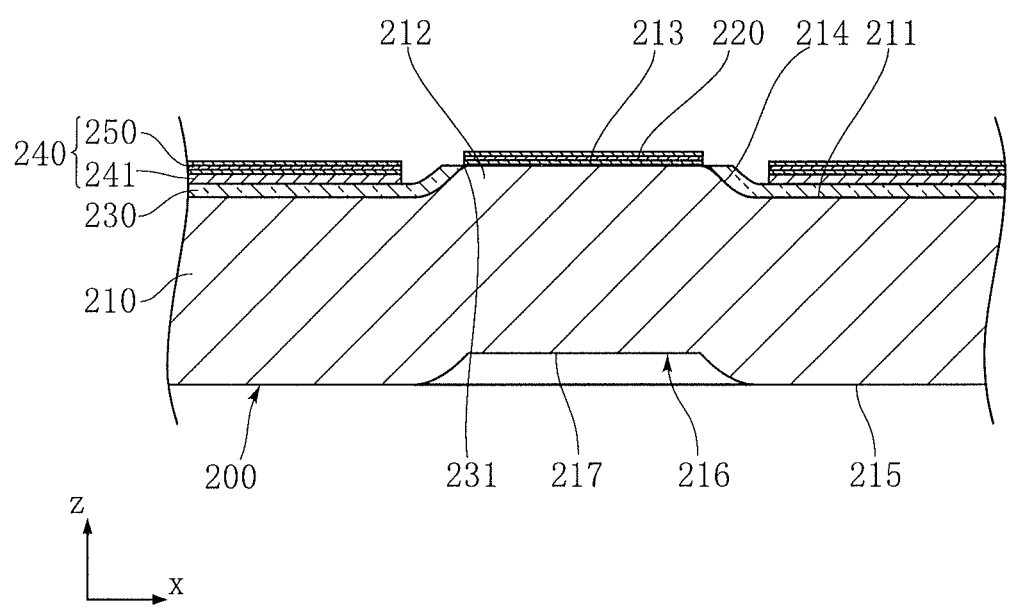
FIG. 9 is a schematic sectional view showing an example of a method of making the LED lighting module of FIG. 1.

Then, as shown in FIG. 9, a plating layer 220 and a plating layer 250 are formed. For instance, the plating layer 220 and the plating layer 250 are formed by electroless plating. Thus, the plating layer 220 and the plating layer 250 are formed to cover the top surface 213 of the base 210 and the base layer 241, which are conductors, and not formed on the insulating layer 230. To form the plating layer 220 and the plating layer 250, Ni-plating, Pd-plating and Au-plating are performed in the mentioned order. By this process, the Ni layer 221, the Pd layer 222, the Au layer 223 and the Ni layer 251, the Pd layer 252, the Au layer 253, which are shown in FIG. 3, are obtained. The Ni layer 221 and the Ni layer 251 are formed at the same time and have a thickness of e.g. about 5 μm. The Pd layer 222 and the Pd layer 252 are formed at the same time and have a thickness of e.g. about 0.1 μm. The Au layer 223 and the Au layer 253 are formed at the same time and have a thickness of about 0.1 μm. By the above-described process steps, a substrate 200 made up of a base 210, a plating layer 220, an insulating layer 230 and a wiring layer 240 is obtained.

Thereafter, formation of the case 500, mounting of the LED chip 300, bonding of the wire 390 and formation of the sealing resin 420 are performed, whereby the LED lighting module 101 is obtained. In mounting the LED chip 300, for example, a metal layer of Sn or Au—Sn alloy formed in advance on the lower surface layer of the LED chip 300 and the Au layer 223 which is the top layer of the plating layer 220 are bonded to each other by eutectic bonding. The eutectic bonding of Sn and Au produces a metal bonding layer 311.

The advantages of the LED lighting module 101 are described below.

According to this embodiment, the LED chip 300 is supported on the raised portion 212 without the intervention of the insulating layer 230. Thus, heat transfer from the LED chip 300 is not blocked by the insulating layer 230. Thus, heat from the LED chip 300 is reliably dissipated, which allows enhancement of the brightness of the LED lighting module 101.

The wiring layer 240 is formed on the insulating layer 230 and arranged at portions which avoid the raised portion 212 (base 210). This arrangement prevents undesirable electrical connection between the base 210 made of metal and the wiring layer 240.

In the raised portion 212, the top surface 213 is exposed from the insulating layer 230, and the portions other than the top surface 213 are covered by the insulating layer 230. With this arrangement, mounting the LED chip 300 on the top surface 213, which is parallel to the principal surface 211, is performed easily. Depending on the method of removing the insulating layer 230, not only the top surface 213 but also the inclined surface 214 may be exposed from the insulating layer.

The provision of the recessed portion 216 on the reverse side of the raised portion 212 is advantageous in that the raised portion 212 is easily formed by pushing the mold member 610 from the reverse surface 215' side of the metal plate 210', as shown in FIG. 7.

Bonding the LED chip 300 on the raised portion 212 via the metal bonding layer 311 enhances heat dissipation from the LED chip 300. Since the metal bonding layer 311 is produced by eutectic bonding of Sn and Au, it is strong and suitable for quick heat transfer.

As described with reference to FIG. 8, the insulating layer 230 having an opening 231 is formed by removing a part of the insulating layer 230' with a squeegee 630. Thus, it is not necessary to pattern the insulating layer 230' by etching or the like in order to expose the raised portion 212. This is advantageous for reducing the manufacturing cost and enhancing the manufacturing efficiency of the LED lighting module 101. The work of moving the edge of the squeegee 630 along the top surface 213 is relatively easy and suitable for reliably removing the portion of the insulating layer 230' which covers the top surface 213.

After the removal operation using a squeegee 630 shown in FIG. 8 is performed, the remaining metal portions that are exposed are the base layer 241 and the top surface 213. Thus, the plating layer 220 and the plating layer 250 are formed at the same time on these portions by e.g. electroplating. The plating layer 220 is suitable for mounting the LED chip 300 on it. The plating layer 250 enhances the bonding strength of the wire 390, for example.

FIGS. 10-22 show other embodiments of the present invention. In these figures, the elements that are identical or similar to those of the foregoing embodiment are designated by the same reference signs.

Figure 10:
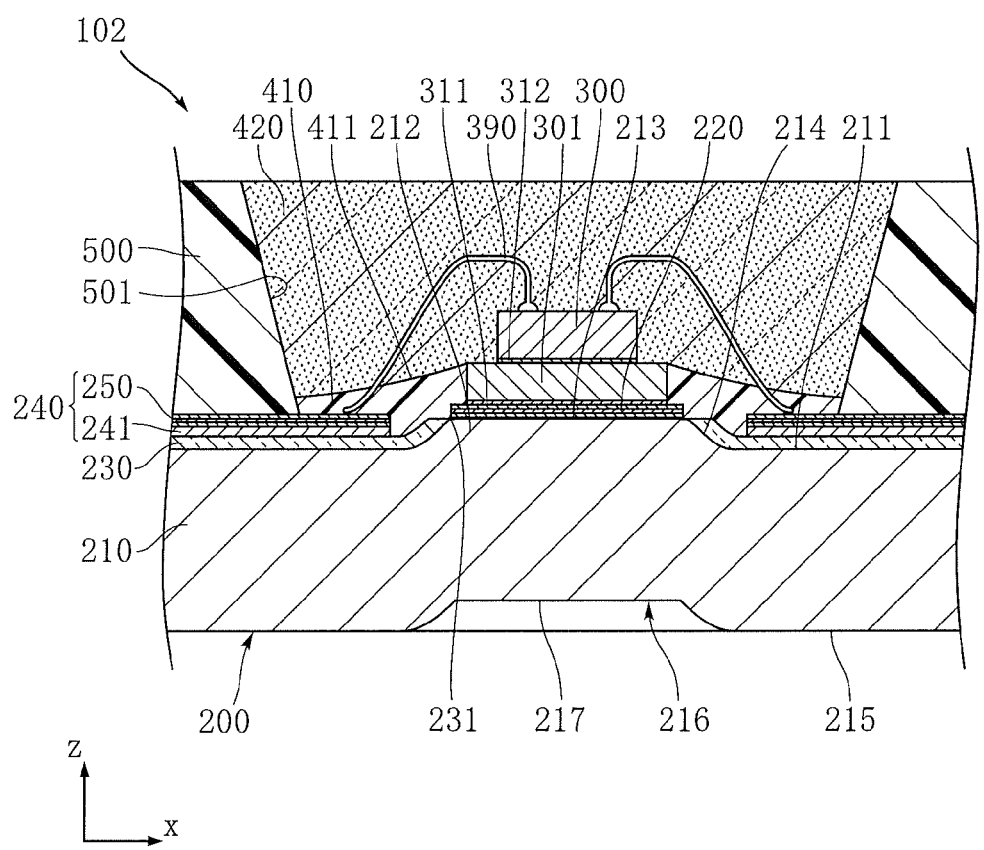
FIG. 10 is a schematic sectional view showing an LED lighting module according to a second embodiment of the present invention.

FIG. 10 shows an LED lighting module according to a second embodiment of the present invention. The LED lighting module 102 of this embodiment differs from the foregoing embodiment in that it includes a sub-mount substrate 301 and a reflective resin 410. In this embodiment, the raised portion 212 corresponds to an example of seat portion of the present invention.

The sub-mount substrate 301 is made of e.g. Si and has a thickness of e.g. about 300 μm. In this embodiment, the LED chip 300 is supported on the raised portion 212 of the base 210 indirectly via the sub-mount substrate 301. The sub-mount substrate 301 and the plating layer 220 are bonded together via the metal bonding layer 311. In this embodiment, the metal bonding layer 311 is made of e.g. Ag. The LED chip 300 and the sub-mount substrate 301 are bonded together via a bonding layer 312 made of e.g. Si or an epoxy resin.

The reflective resin 410 is made of a white resin such as silicone resin in which e.g. titanium oxide is mixed. The reflective resin 410 covers the side surface of the sub-mount substrate 301, the plating layer 220, the wiring layer 240 and the insulating layer 230, and has an outer edge adjoining the reflective surface 501 of the case 500. The reflective resin 410 exposes the upper surface of the sub-mount substrate 301. The reflective resin 410 has a reflective surface 411. The reflective surface 411 is gently inclined in such a manner as to come closer to the base 210 in the z direction as proceeding from near the upper surface of the sub-mount substrate 301 toward the reflective surface 501 of the case 500.

In this embodiment, the fluorescent substance contained in the sealing resin 420 is a sulfide-based fluorescent substance. The sulfide-based fluorescent substance contains at least one sulfide selected from the group consisting of calcium sulfide (CaS), zinc sulfide (ZnS), strontium sulfide (SrS), strontium thiogallate ($SrGa_2S_4$) and calcium thiogallate ($CaGa_2S_4$). The sulfide-based fluorescent substance constituting a fluorescent element 65 is doped with at least one of Eu, Tb, Sm, Pr, Dy and Tm.

When a fluorescent substance that emits red light is employed, the peak of the wavelength of the light emitted is 625-740 nm. For instance, the fluorescent substance that emits red light comprises calcium sulfide doped with europium (CaS:Eu), zinc sulfide doped with europium (ZnS:Eu) or strontium sulfide doped with europium (SrS:Eu). When a fluorescent substance that emits green light is employed, the peak of the wavelength of the light emitted is 500-565 nm. For instance, the fluorescent substance that emits green light comprises strontium thiogallate doped with europium ($SrGa_2S_4$:Eu) or calcium thiogallate doped with europium ($CaGa_2S_4$:Eu). The element to be doped in a fluorescent substance for emitting red light or a fluorescent substance for emitting green light is not limited to Eu, and any of Tb, Sm, Pr, Dy and Tm may be used.

According to this embodiment, even when the wiring layer 240 changes its color due to deterioration with the use of the LED lighting module 102 and the reflectivity is deteriorated, light from the LED chip 300 is reflected upward by the reflective surface 411 of the reflective resin 410. Thus, brightness of the LED lighting module 102 is enhanced. Moreover, since the wiring layer 240 is covered by the reflective resin 410, the reflective resin 410 serves as a protective film. This prevents e.g. sulfidizing gas from reacting with the wiring layer 240. In particular, the sealing resin 420 contains a sulfide-based fluorescent substance, and deterioration of the wiring layer 240 due to sulfidizing gas generated from the sealing resin is prevented. Since the light from the LED chip 300 is reflected upward by the reflective resin 410, brightness of the LED lighting module 102 enhances. Moreover, the provision of the sealing resin 420 containing a sulfide-based fluorescent substance allows emission of brighter white light.

Figure 11:
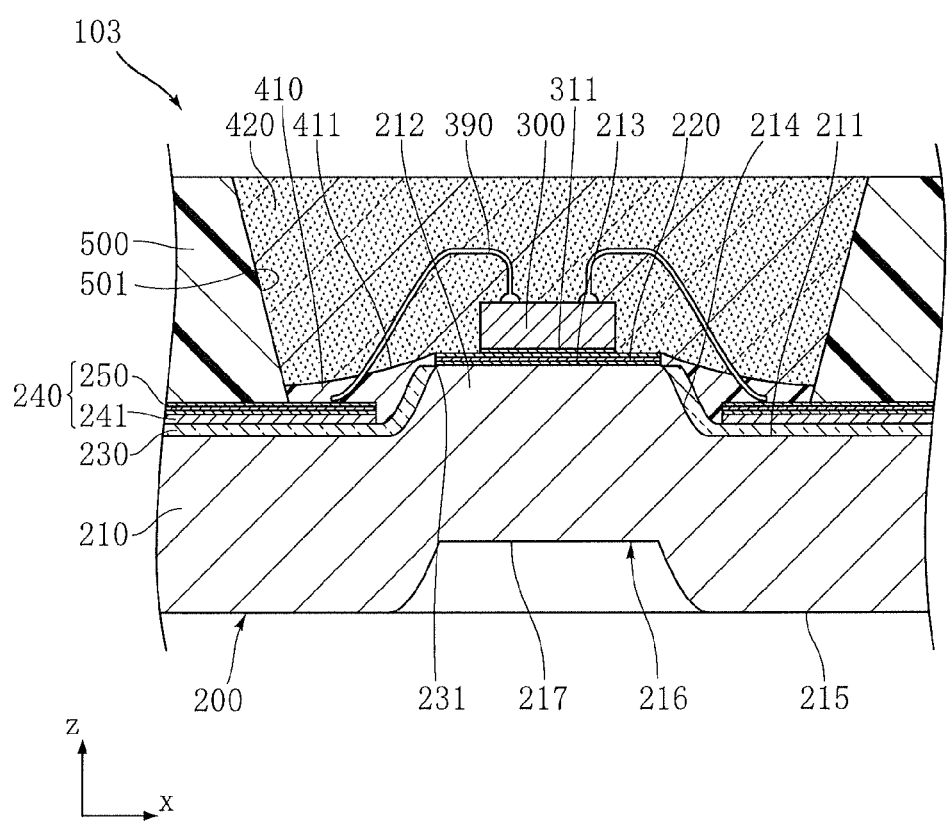
FIG. 11 is a schematic sectional view showing an LED lighting module according to a third embodiment of the present invention.

FIG. 11 shows an LED lighting module according to a third embodiment of the present invention. The LED lighting module 103 of this embodiment differs from the LED lighting module 101 in that it includes a reflective resin 410 and differs from the LED lighting module 102 in structure of the base 210.

In this embodiment, the raised portion 212 of the base 210 is raised upward by a larger amount in the z direction than in the LED lighting modules 101, 102, and the height in the z direction from the principal surface 211 to the top surface 213 is set to e.g. 450-500 µm. Correspondingly to this, the depth of the recessed portion 216 of the base 210 from the reverse surface 215 to the bottom surface 217 is set to e.g. 450-500 µm. The reflective resin 410 covers the insulating layer 230 and the wiring layer 240 and exposes the plating layer 220. The reflective surface 411 of the reflective resin 410 is gently inclined from the edge of the plating layer 220 toward the reflective surface 501 of the case 500. Although the reflective resin 410 covers up to the upper end of the side surface of the plating layer 220 in FIG. 11, the reflective resin 410 may be arranged to cover up to the middle of the inclined portion 214.

According to this embodiment, brightness of the LED lighting module 103 is further enhanced. Further, since the LED chip 300 is directly mounted on the plating layer 220 via the metal bonding layer 311, heat from the LED chip 300 is properly transferred to the base 210 although the reflective resin 410 is provided. Thus, this arrangement is suitable for realizing effective heat dissipation from the LED chip 300. Moreover, the LED chip 300 can be raised to the height to which the reflective resin 410 can be formed, without using a silicon sub-mount. Thus, the step for providing a silicon sub-mount is eliminated, which enhances the production efficiency. Since the number of the parts reduces, reliability and yield are enhanced.

Figure 12:
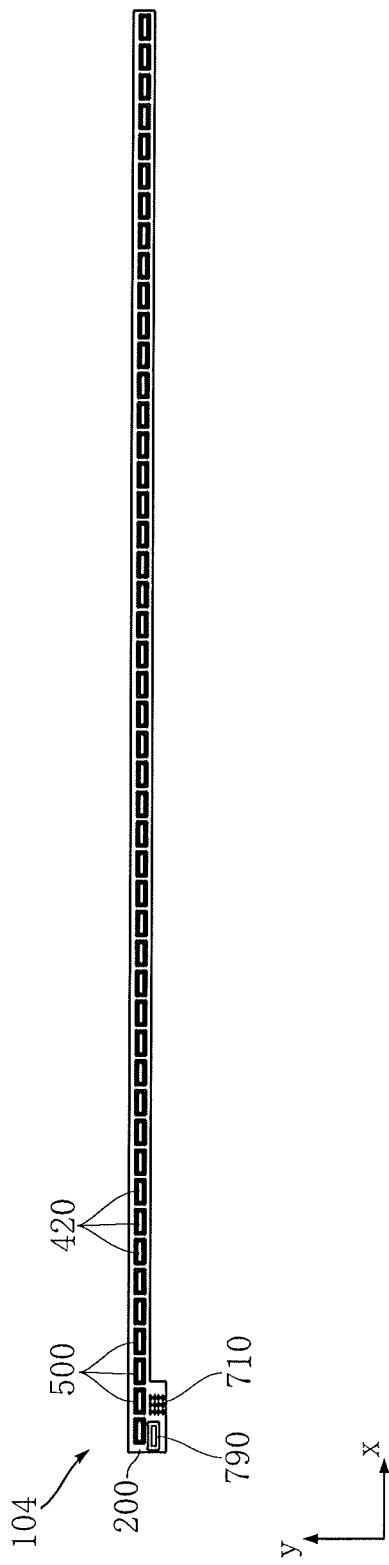
FIG. 12 is a plan view showing an LED lighting module according to a fourth embodiment of the present invention.
Figure 13:
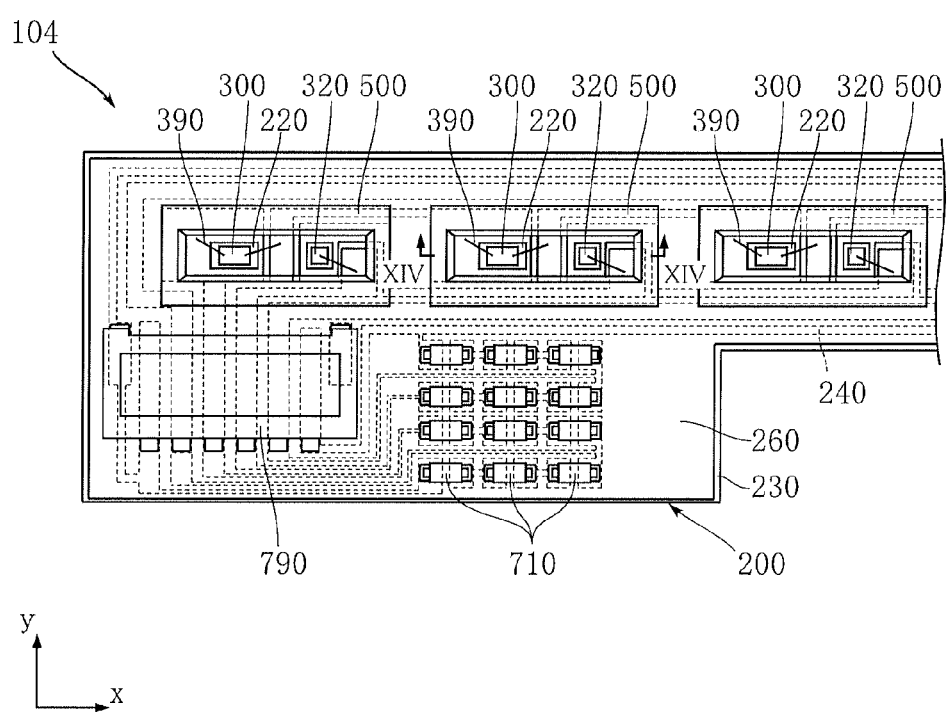
FIG. 13 is a schematic enlarged plan view showing the LED lighting module of FIG. 1.
Figure 14:
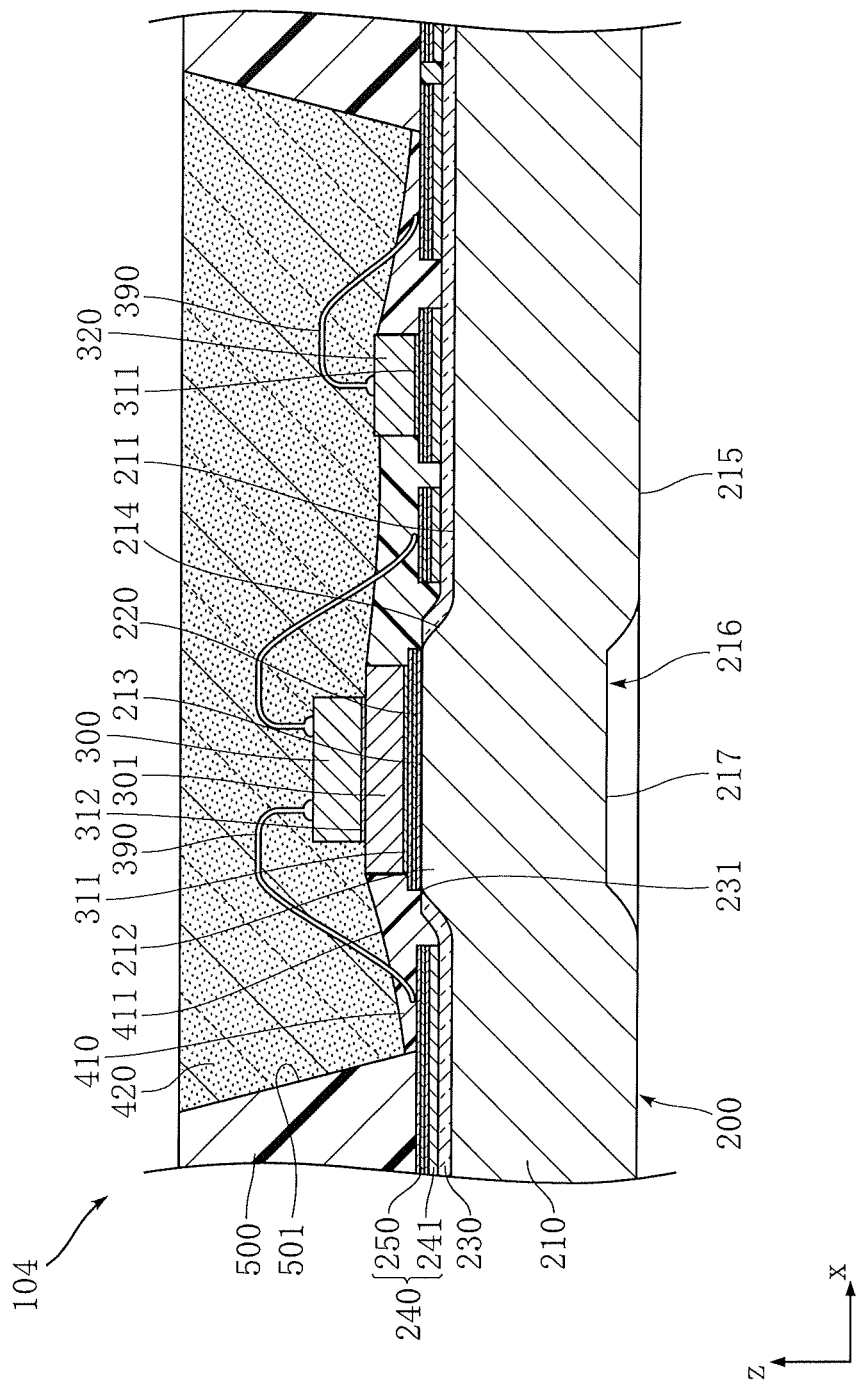
FIG. 14 is a schematic sectional view taken along lines XIV-XIV in FIG. 13.

FIGS. 12-14 show an LED lighting module according to a fourth embodiment of the present invention. The LED lighting module 104 of this embodiment includes a substrate 200, LED chips 300, LED chips 320, sealing resins 420, cases 500, chip resistors 710 and a connector 790. The LED lighting module 104 is structured as a bar-like light source described above and used as arranged to face a side surface of a light guide plate so that planar light is emitted from the light guide plate. In FIG. 13, illustration of sealing resin 420 is omitted for easier understanding.

As shown in FIG. 12, the substrate 200 has a thin elongated shape elongated in the x direction as a whole. A plurality of cases 500 are arranged along the longitudinal direction. In this embodiment, all of the cases 500 have the same shape and same internal structure.

As shown in FIG. 13, the substrate 200 has a wide portion at an end in the x direction. At the wide portion, the chip resistors 710 and the connector 790 are mounted. Each chip resistor 710 is provided for adjusting the difference in operating voltage between an LED chip 300 and an LED chip 320, which will be described later. The connector 790 is used for establishing electrical connection when the LED lighting module 104 is built in e.g. a liquid crystal display.

As shown in FIGS. 13 and 14, one LED chip 300 and one LED chip 320 are arranged in a space surrounded by each of the cases 500. As described above, the LED chip 300 is supported on the top surface 213 of a raised portion 212 of a base 210 and emits e.g. blue light. The LED chip 320 corresponds to the additional LED chip according to the present invention and is supported on the principal surface 211 at a position avoiding the raised portion 212. The LED chip 320 is structured as a so-called single-wire type and emits e.g. red light. The cases 500 are arranged along the longitudinal direction of the substrate 200 so that the LED chips 300 and the LED chips 320 are alternately arranged in the longitudinal direction of the substrate 200. In the region outside the cases 500, the wiring layer 240 is covered by a resist layer 260. For instance, the resist layer 260 is white.

The reflective resin 410 covers the region surrounded by the case 500 except the LED chip 300, the sub-mount substrate 301 and the LED chip 320. The side surface of the sub-mount substrate 301 is covered by the reflective resin 410 and the upper surface of the sub-mount substrate is exposed from the reflective resin 410. The side surface of the LED chip 320 is covered by the reflective resin 410, and the upper surface of the LED chip 320 is exposed from the reflective resin 410.

The sealing resin 420 covers the LED chip 300 and the LED chip 320. The sealing resin 420 is made of a material obtained by mixing a fluorescent substance into e.g. transparent epoxy resin or silicone resin. For instance, the fluorescent substance emits green light when excited by blue light from the LED chip 300. Similarly to the LED lighting module 102, the fluorescent substance is a sulfide-based fluorescent substance.

According to this embodiment again, effective heat dissipation from the LED chip 300 is realized, and brightness of the LED lighting module 104 can be enhanced. In one space surrounded by the case 500, an LED chip 300 that emits blue light and an LED chip 320 that emits red light are arranged, and sealing resin 420 containing a fluorescent substance that emits green light is provided. Thus, white light of a properly mixed color is emitted from each case 500. Thus, uniform and bright white light is emitted from the LED lighting module 104 along the longitudinal direction. This is suitable for constituting a backlight of a liquid crystal display when used with the above-described light guide plate.

Figure 15:
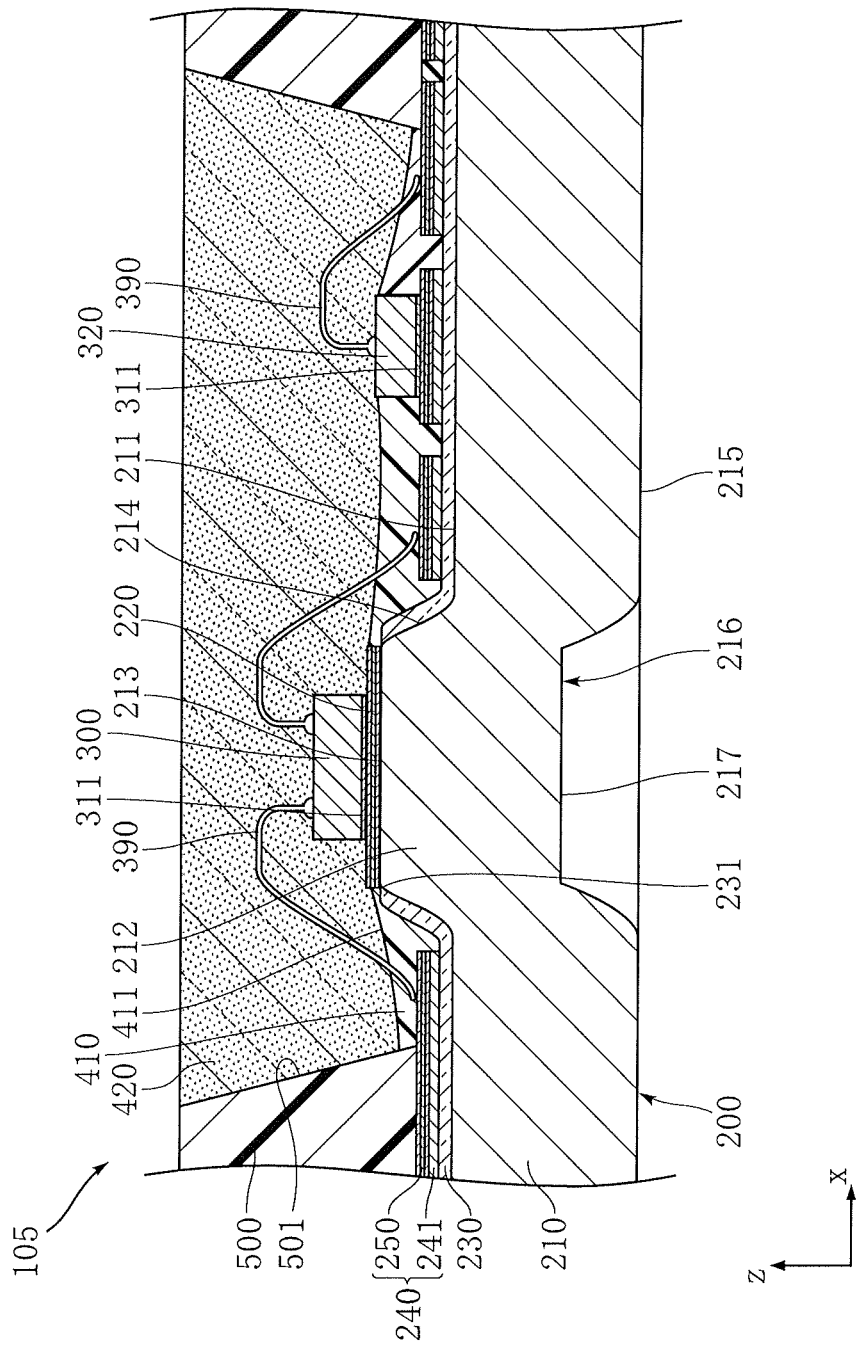
FIG. 15 is a schematic sectional view showing an LED lighting module according to a fifth embodiment of the present invention.

FIG. 15 shows an LED lighting module according to a fifth embodiment of the present invention. The LED lighting module 105 of this embodiment has the same structure as that of the LED lighting module 104 except that it does not include a sub-mount substrate 301. The LED chip 300 is mounted in the same manner as that in the LED module 103. According to this embodiment again, effective heat dissipation from the LED chip 300 is realized, and brightness of the LED lighting module 105 can be enhanced. The LED lighting module 105 can emit uniform and bright white light along the longitudinal direction.

Figure 16:
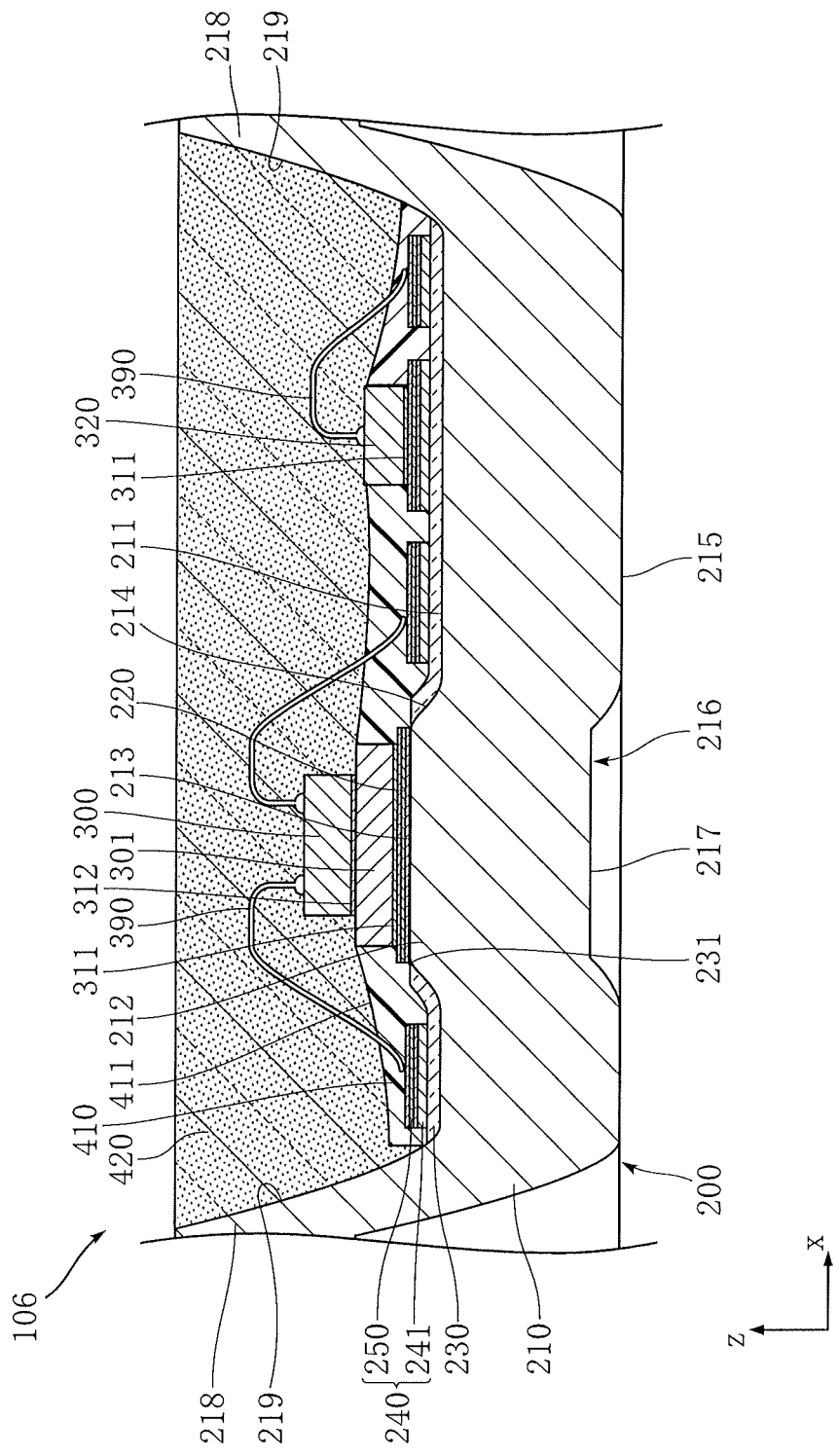
FIG. 16 is a schematic sectional view showing an LED lighting module according to a sixth embodiment of the present invention.

FIG. 16 shows an LED lighting module according to a sixth embodiment of the present invention. The LED lighting module 106 of this embodiment has the same structure as that of the LED lighting module 104 except that a plurality of enclosing raised portions 218 are provided on the base 210, instead of the cases 500. Each of the enclosing raised portions 218, formed in the same manner as that for forming the raised portion 212, may be rectangular, as viewed in plan. The LED chip 300 and the LED chip 320 are arranged in the region surrounded by the raised portion 218. The raised portion 218 has a reflective surface 219. The reflective surface 219 reflects light from the LED chip 300 and the LED chip 320 upward in the figure. According to this embodiment again, effective heat dissipation from the LED chip 300 is realized, and brightness of the LED lighting module 106 can be enhanced. The LED lighting module 106 can emit uniform and bright white light along the longitudinal direction. Since the cases 500 are not provided, the cost for manufacturing the LED lighting module 106 is reduced.

Figure 17:
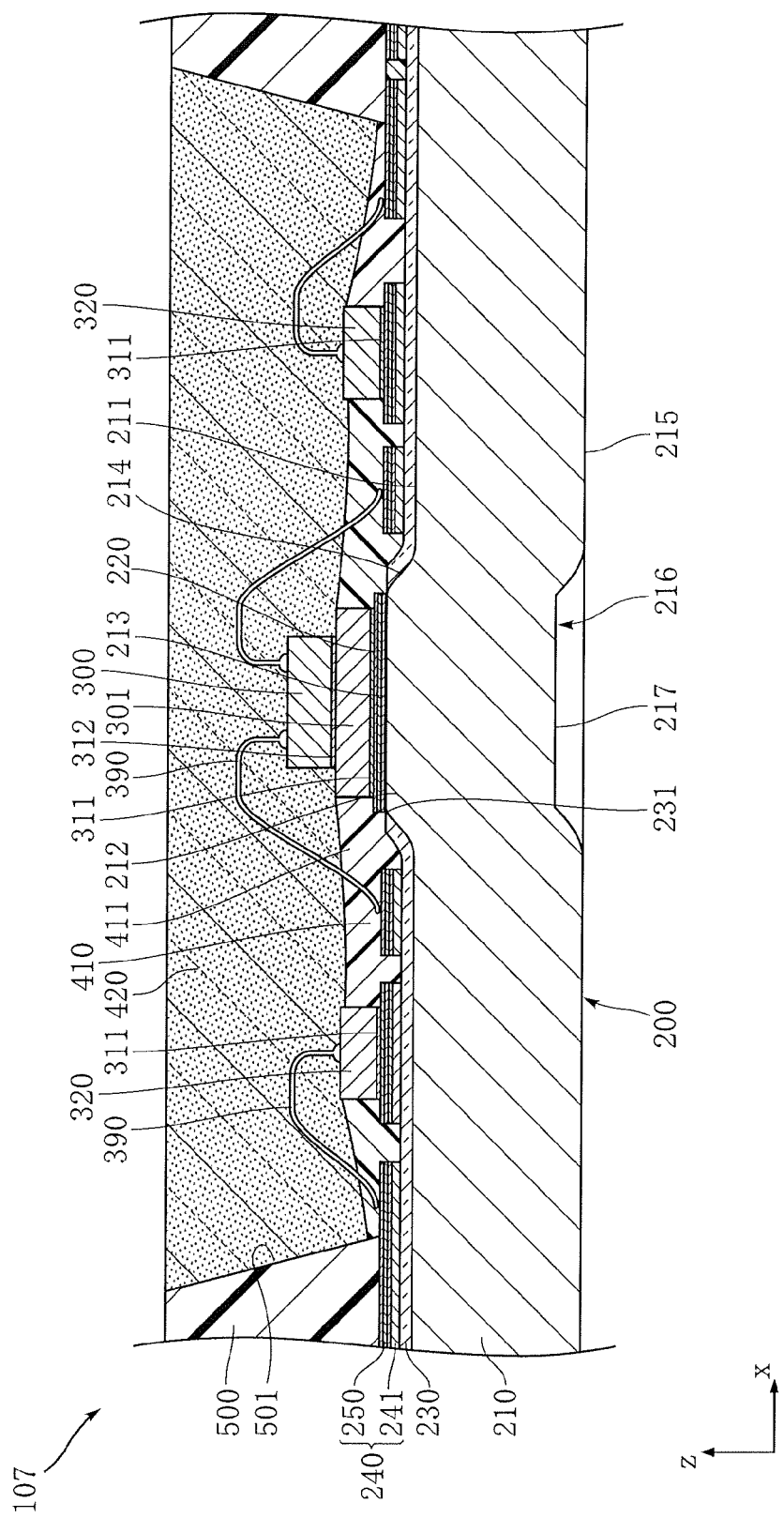
FIG. 17 is a schematic sectional view showing an LED lighting module according to a seventh embodiment of the present invention.

FIG. 17 shows an LED lighting module according to a seventh embodiment of the present invention. The LED lighting module 107 of this embodiment has the same structure as that of the LED lighting module 104 except that it includes two LED chips 320. In this embodiment, two LED chips 320 are arranged as spaced apart from each other in the x direction to sandwich the LED chip 300 between them. According to this embodiment again, effective heat dissipation from the LED chip 300 is realized, and brightness of the LED lighting module 107 can be enhanced. The LED lighting module 107 can emit uniform and bright white light along the longitudinal direction. In the case where LED chips 320 emit red light, the amount of red light emitted from one LED chip 320 may be smaller than the amount of blue light emitted from one LED chip 300. According to this embodiment, a shortage of red light relative to the amount of blue light is avoided.

Figure 18:
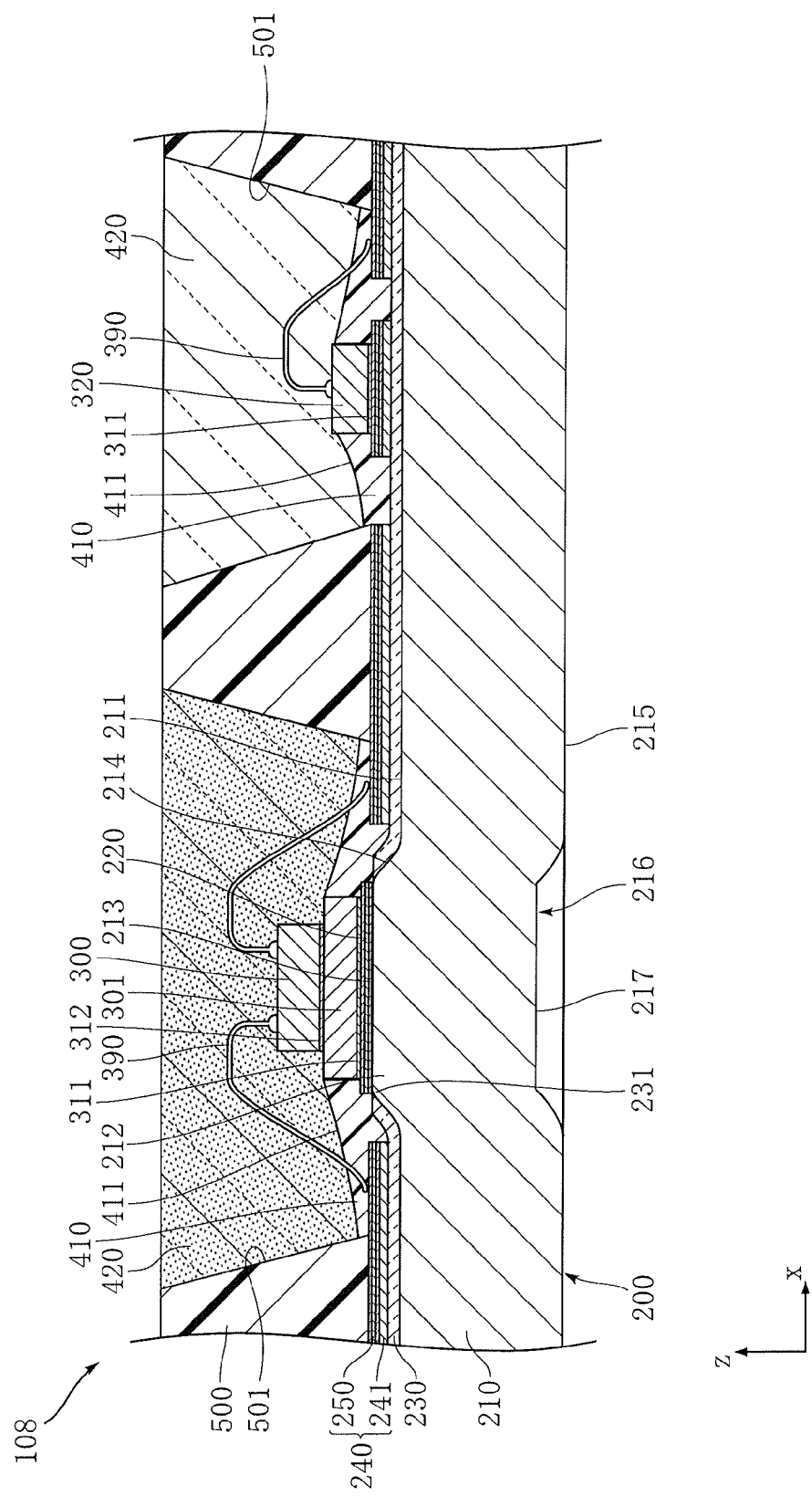
FIG. 18 is a schematic sectional view showing an LED lighting module according to an eighth embodiment of the present invention.

FIG. 18 shows an LED lighting module according to an eighth embodiment of the present invention. In the LED lighting module 108 of this embodiment, similarly to the LED light source module 104, a plurality of LED chips 300 and a plurality of LED chips 320 are alternately arranged along the longitudinal direction of the substrate 200. In each space surrounded by a case 500, only a single LED chip 300 or only a single LED chip 320 is arranged. The case 500 may include two internal spaces as shown in the figure, or alternatively, a smaller case 500 having only one internal space may be provided for each of the LED chip 300 and the LED chip 320.

Of the internal spaces of the case 500, the space in which the LED chip 300 is arranged are filled with sealing resin 420 containing a fluorescent substance as described above. On the other hand, of the internal spaces of the case 500, the space in which the LED chip 320 is arranged is filled with transparent sealing resin 421. The sealing resin 421 corresponds to the additional sealing resin according to the present invention.

According to this embodiment again, effective heat dissipation from the LED chip 300 is realized, and brightness of the LED lighting module 108 can be enhanced. The LED lighting module 108 can emit uniform and bright white light along the longitudinal direction. Moreover, red light from the LED chip 320 passes through the transparent sealing resin 421 and is not absorbed by the fluorescent substance in the sealing resin 420. This is advantageous for increasing the amount of red light. Moreover, since the amount of the fluorescent substance used is reduced, the manufacturing cost is reduced.

Figure 19:
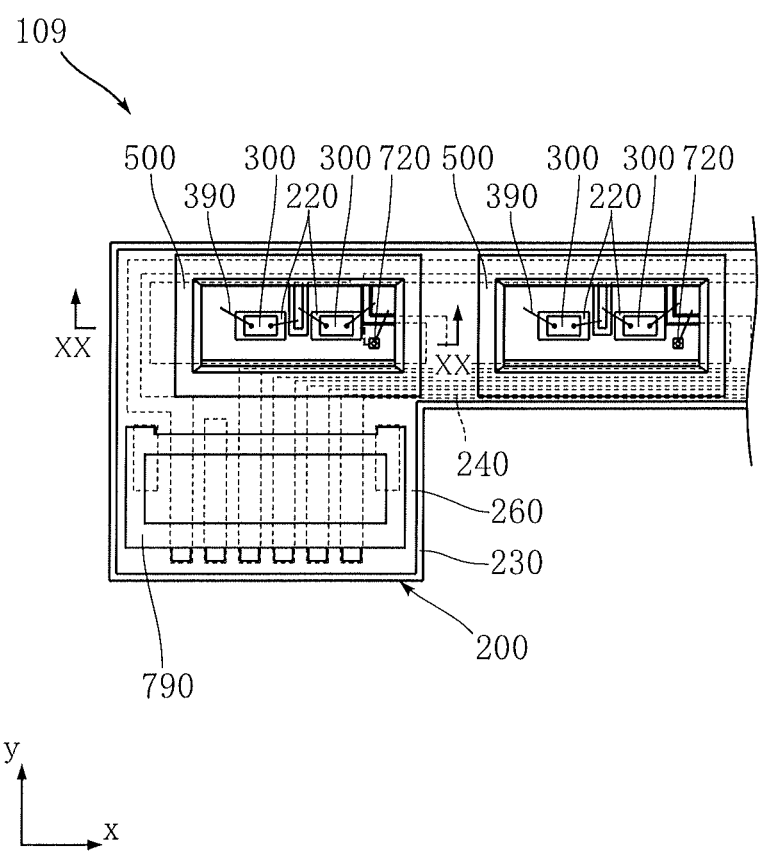
FIG. 19 is a schematic enlarged plan view showing an LED lighting module according to a ninth embodiment of the present invention.
Figure 20:
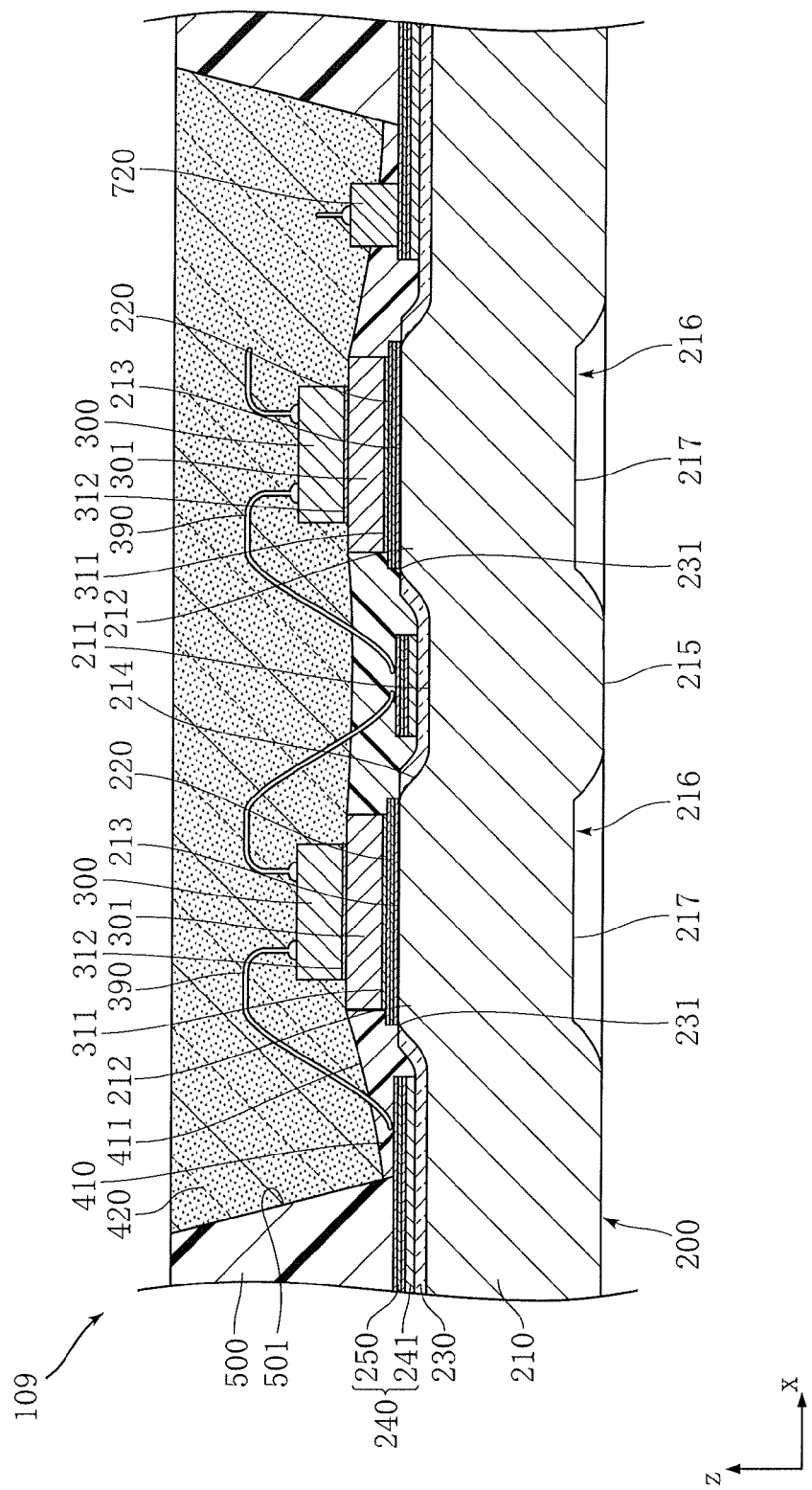
FIG. 20 is a schematic sectional view taken along lines XX-XX in FIG. 19.

FIGS. 19 and 20 show an LED lighting module according to a ninth embodiment of the present invention. In the LED lighting module 109 of this embodiment, two LED chips 300 are arranged in a single internal space of each case 500. The two LED chips 300 are arranged along the x direction. The base 210 has two raised portions 212 within a single internal space of a case 500. Each of two LED chips 300 is supported on a respective one of the two raised portions 212.

The LED lighting module 109 further includes Zener diodes 720. Each of the Zener diodes 720 is arranged in the internal space of each case 500 along with the two LED chips 300. The Zener diodes 720 have the function to prevent application of excessive reverse voltage to the LED chips 300.

According to this embodiment again, effective heat dissipation from the LED chip 300 is realized, and brightness of the LED lighting module 109 can be enhanced. The LED lighting module 109 can emit uniform and bright white light along the longitudinal direction.

Figure 21:
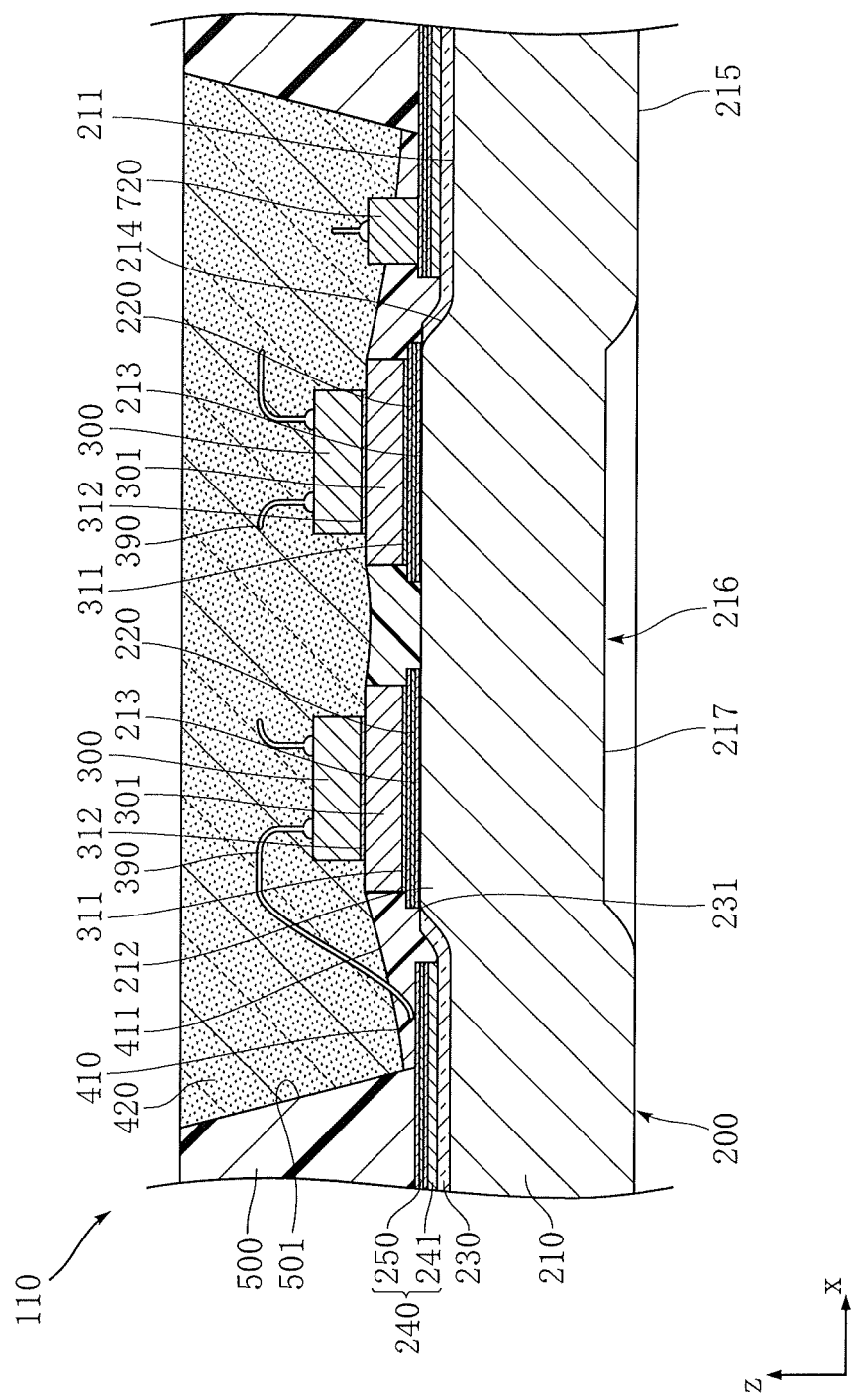
FIG. 21 is a schematic sectional view showing an LED lighting module according to a tenth embodiment of the present invention.

FIG. 21 shows an LED lighting module according to a tenth embodiment of the present invention. In the LED lighting module 110 of this embodiment, two LED chips 300 are arranged in a single internal space of each case 500, similarly to the LED lighting module 109. In this embodiment, only a single raised portion 212 is provided in one internal region of the case 500, and the single raised portion 212 supports two LED chips 300. In this arrangement, it is difficult to arrange the wiring layer 240 in the portion sandwiched between the two the LED chips 300 in the x direction. Thus, the wiring layer 240 is arranged at a position avoiding the two LED chips 300 in the y direction, and wires 390 are connected from each of the LED chips 300 to the wiring layer 240.

According to this embodiment again, effective heat dissipation from the LED chip 300 is realized, and brightness of the LED lighting module 110 can be enhanced. The LED lighting module 110 can emit uniform and bright white light along the longitudinal direction. Moreover, the distance between the adjacent LED chips 300 can be reduced, so that the LED chips 300 can be mounted at a high density.

As will be understood from the LED modules 109 and 110, two LED chips 300, i.e., a plurality of LED chips 300 can be arranged in a single internal region of a case 500. Three or more LED chips 300 can be arranged in a single internal space of a case 500.

Figure 22:
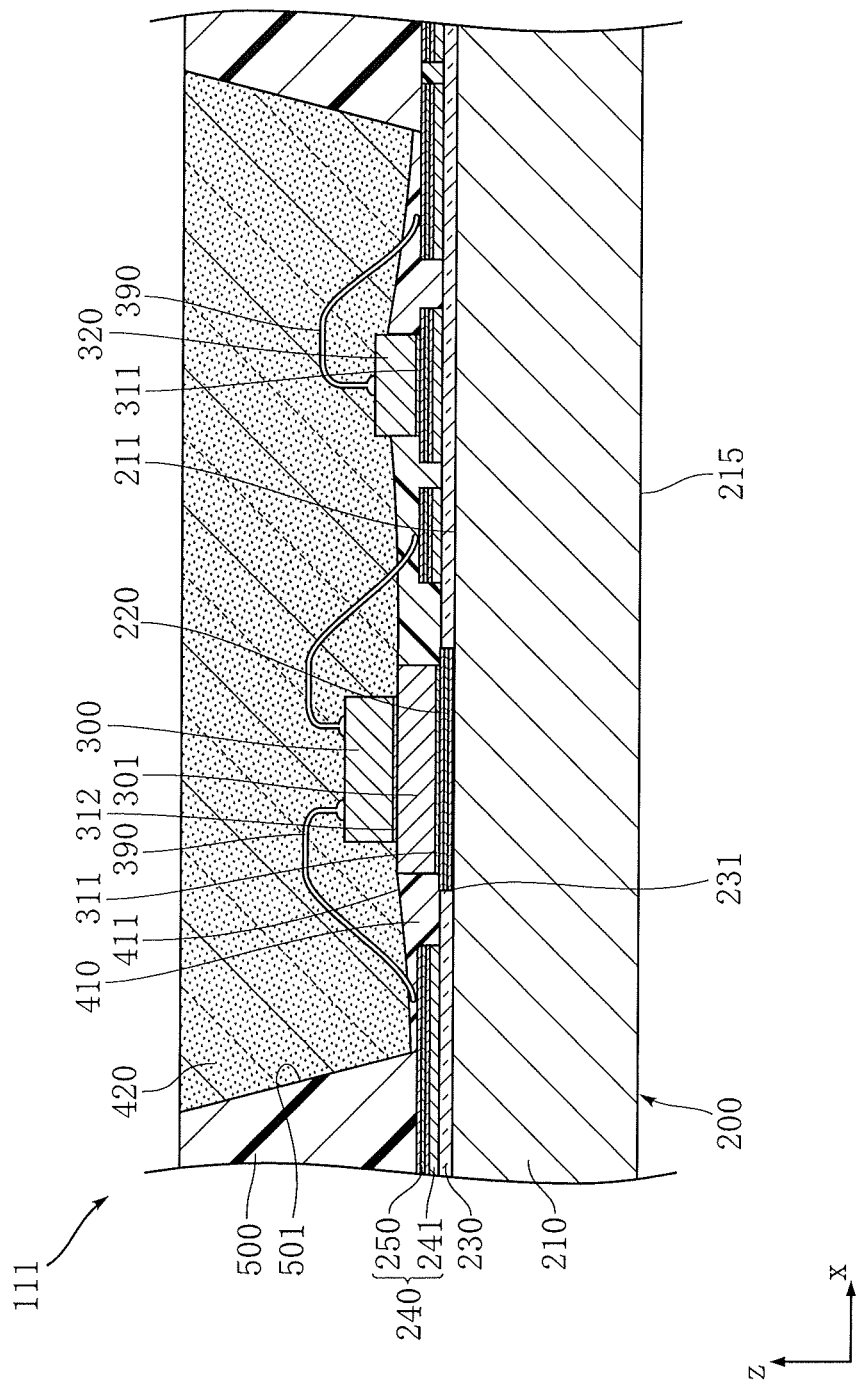
FIG. 22 is a schematic sectional view showing an LED lighting module according to an eleventh embodiment of the present invention.

FIG. 22 shows an LED lighting module according to an eleventh embodiment of the present invention. In the LED lighting module 111 of this embodiment, one LED chip 300 and one LED chip 320 are arranged in one internal space of a case 500, similarly to the LED lighting module 104. The base 210 does not have a raised portion 212.

The insulating layer 230 has an opening 231. The opening 231 exposes a part of the principal surface 211 of the base 200. The LED chip 300 is supported on the portion of the principal surface 211 which is exposed through the opening 231. Between the LED chip 300 and the principal surface 211 of the base 210 are provided a plating layer 220 and a sub-mount substrate 301. Due to the provision of the sub-mount substrate 301, the LED chip 300 is arranged at a position higher than the principal surface 211 in the z direction.

According to this embodiment again, effective heat dissipation from the LED chip 300 is realized, and brightness of the LED lighting module 110 can be enhanced. The LED lighting module 111 can emit uniform and bright white light along the longitudinal direction.

Figure 23:
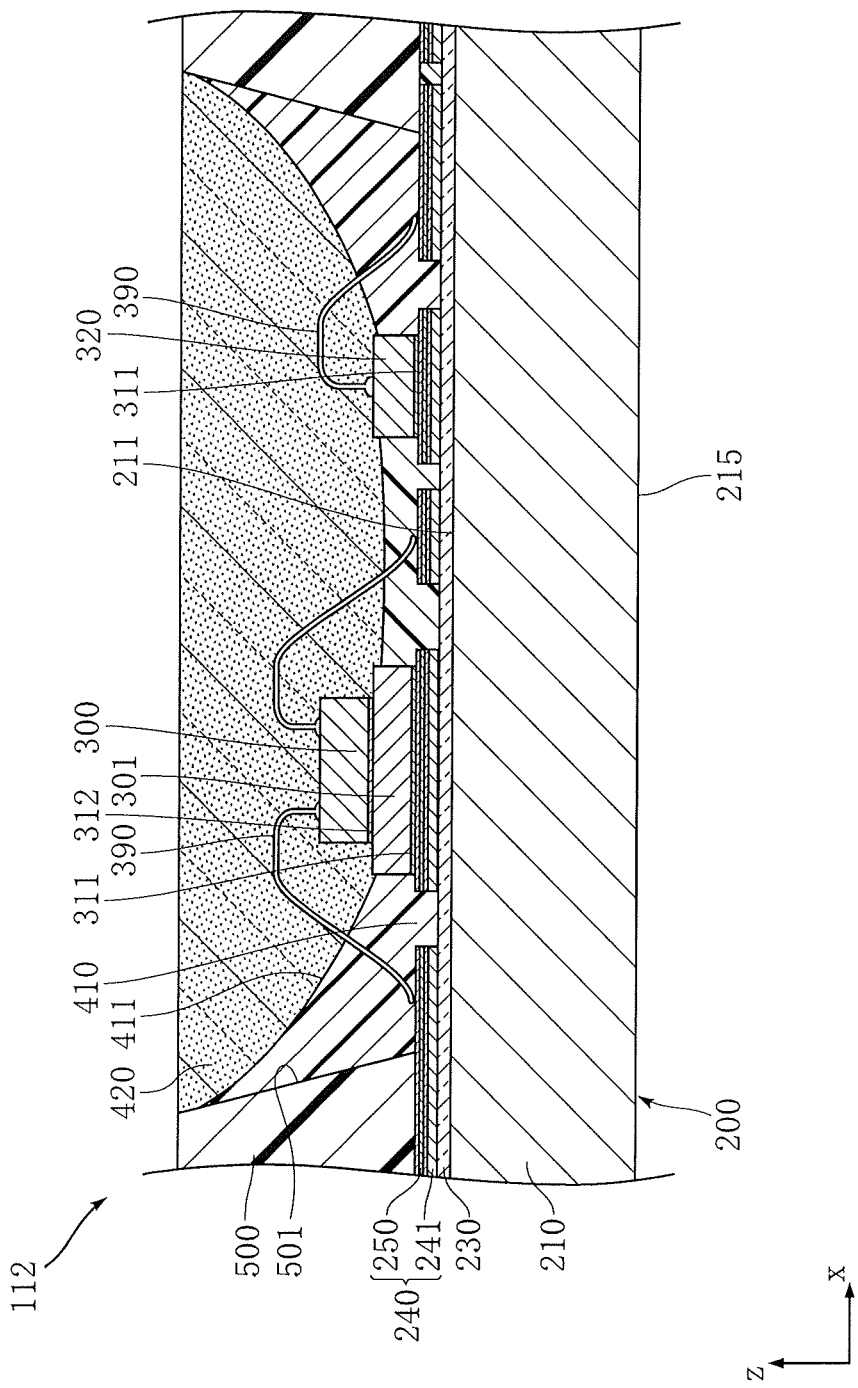
FIG. 23 is a schematic sectional view showing an LED lighting module according to a twelfth embodiment of the present invention.
Figure 24:
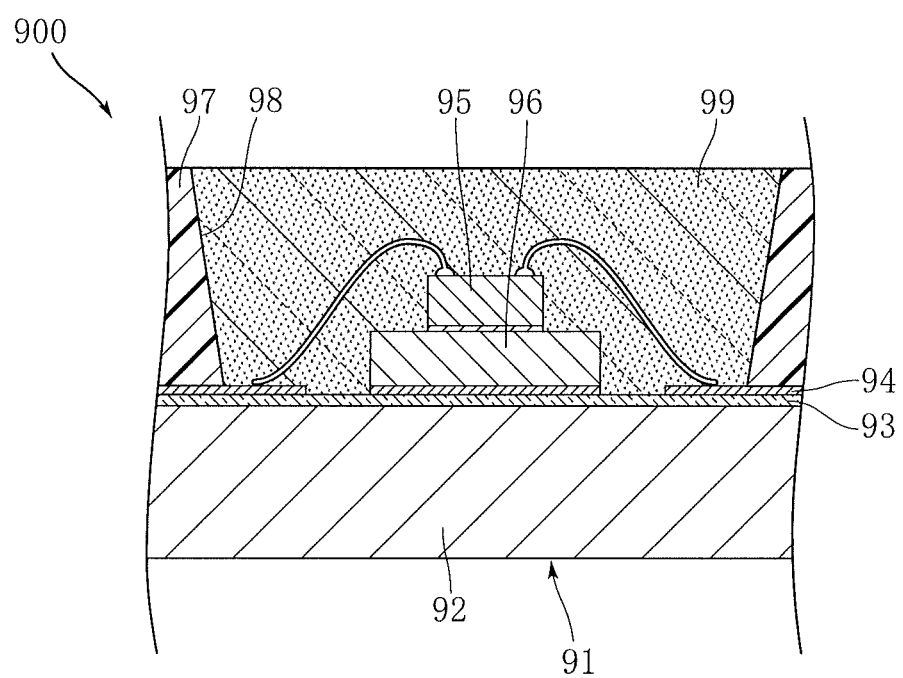
FIG. 24 is a schematic sectional view showing a conventional LED lighting module.

FIG. 23 shows an LED lighting module according to a twelfth embodiment of the present invention. In the LED lighting module 112 of this embodiment, the entirety of the principal surface 211 of the base 210 is covered by the insulating layer 230. The sub-mount substrate 301 is arranged on the insulating layer 230. The upper surface of the sub-mount substrate 301 is at a position higher than the principal surface 211 of the base 210. In this structure, the sub-mount substrate 301 is an example of the seat portion of the present invention. The surface of the sub-mount substrate 301 which faces in the direction normal to the principal surface 211 corresponds to the upper surface of the present invention.

The reflective resin 410 covers the side surface of the sub-mount substrate 301, the wiring layer 240 and the insulating layer 230 and has an outer edge in contact with the reflective surface 501 of the case 500. The reflective resin 410 has a reflective surface 411 inclined to become farther away from the substrate 200 as proceeding toward the case 500. Of the bonding portion between the reflective resin 410 and the case 500, the portion farthest away from the principal surface 211 of the base 210 is farther from the principal surface 211 than any portion of the sub-mount substrate 301 as the seat portion is. Moreover, in this embodiment, of the bonding portion between the reflective resin 410 and the case 500, the portion farthest away from the principal surface 211 is farther from the principal surface 211 than any portion of the LED chip 300.

In this embodiment again, the sealing resin 420 contains a sulfide-based fluorescent substance as described above.

The LED lighting module according to the present invention is not limited to the foregoing embodiments. The specific structure of each part of the LED lighting module according to the present invention can be varied in design in many ways.

The invention claimed is:

1. An LED lighting module, comprising:
a substrate including a base and an insulating layer, the base being made of metal and including a principal surface and a raised portion raised above the principal surface, the insulating layer covering the principal surface of the base and exposing at least a part of the raised portion; and
an LED chip supported on the raised portion,
wherein the substrate includes a wiring layer formed on the insulating layer,
wherein the raised portion includes a top surface and an inclined surface, the top surface being parallel to the principal surface, the inclined surface connecting the top surface and the principal surface to each other,
wherein the insulating layer exposes the top surface of the raised portion, and
wherein the base includes a recessed portion which is on an opposite side from the raised portion in a thickness direction and which overlaps the raised portion as viewed in the thickness direction.

2. The LED lighting module according to claim 1, further comprising a sub-mount substrate disposed between the raised portion and the LED chip.

3. The LED lighting module according to claim 1, wherein the recessed portion has a bottom surface parallel to the principal surface.

4. The LED lighting module according to claim 3, wherein the bottom surface is inside the raised portion as viewed in the thickness direction.

5. The LED lighting module according to claim 1, wherein the LED chip is bonded to the raised portion via a metal bonding layer.

6. The LED lighting module according to claim 5, wherein the substrate includes a base plating layer disposed between the metal bonding layer and the top surface.

7. An LED lighting module, comprising:
a substrate including a base and an insulating layer, the base being made of metal and including a principal surface and a raised portion raised above the principal surface, the insulating layer covering the principal surface of the base and exposing at least a part of the raised portion; and
an LED chip supported on the raised portion,
wherein the substrate includes a wiring layer formed on the insulating layer,
wherein the raised portion includes a top surface and an inclined surface, the top surface being parallel to the principal surface, the inclined surface connecting the top surface and the principal surface to each other,
wherein the LED chip is bonded to the raised portion via a metal bonding layer,
wherein the substrate includes a base plating layer disposed between the metal bonding layer and the top surface, and
wherein the base plating layer comprises a plurality of layers including a top layer made of Au.

8. The LED lighting module according to claim 7, wherein the metal bonding layer is a eutectic bonding layer of Sn and Au.

9. An LED lighting module, comprising:
a substrate including a base and an insulating layer, the base being made of metal and including a principal surface and a raised portion raised above the principal surface, the insulating layer covering the principal surface of the base and exposing at least a part of the raised portion; and
an LED chip supported on the raised portion,
wherein the substrate includes a wiring layer formed on the insulating layer,
wherein the raised portion includes a top surface and an inclined surface, the top surface being parallel to the principal surface, the inclined surface connecting the top surface and the principal surface to each other,
wherein the LED chip is bonded to the raised portion via a metal bonding layer,
wherein the substrate includes a base plating layer disposed between the metal bonding layer and the top surface, and
wherein the wiring layer includes a base layer and a wiring plating layer, the base layer being formed on the insulating layer, the wiring plating layer covering the base layer.

10. The LED lighting module according to claim 9, wherein the wiring plating layer has a same multi-layer laminated structure as that of the base plating layer.

11. An LED lighting module comprising:
a substrate including a base and an insulating layer, the base being made of metal and including a principal surface and a raised portion raised above the principal surface, the insulating layer covering the principal surface of the base and exposing at least a part of the raised portion; and
an LED chip supported on the raised portion,
wherein the substrate includes a wiring layer formed on the insulating layer,
wherein the raised portion includes a top surface and an inclined surface, the top surface being parallel to the principal surface, the inclined surface connecting the top surface and the surface to each other,
wherein the LED lighting module further comprising: a sub-mount substrate disposed between the raised portion and the LED chip; and
wherein a reflective resin exposes a surface of the sub-mount substrate on which the LED chip is mounted, the reflective resin covering at least a part of each of the wiring layer and the insulating layer.

12. The LED lighting module according to claim 11, further comprising a case including a reflective surface surrounding the LED chip,
wherein the reflective resin covers a region extending from the sub-mount substrate to the reflective surface.

13. An LED lighting module, comprising:
a substrate including a base and an insulating layer, the base being made of metal and including a principal surface and a raised portion raised above the principal surface, the insulating layer covering the principal surface of the base and exposing at least a part of the raised portion; and
an LED chip supported on the raised portion,
wherein the substrate includes a wiring layer formed on the insulating layer,
wherein the raised portion includes a top surface and an inclined surface, the top surface being parallel to the principal surface, the inclined surface connecting the top surface and the principal surface to each other,
wherein the LED chip is bonded to the raised portion via a metal bonding layer,
wherein the substrate includes a base plating layer disposed between the metal bonding layer and the top surface,
wherein, in a direction in which the principal surface faces, the top surface of the raised portion is farther away from the principal surface than the wiring layer is, and the LED lighting module further comprises a reflective resin exposing the base plating layer and covering at least a part of each of the wiring layer and the insulating layer.

14. The LED lighting module according to claim 13, further comprising a case including a reflective surface surrounding the LED chip,
wherein the reflective resin covers a region extending from the base plating layer to the reflective surface.

15. An LED lighting module comprising:
a substrate including a base and an insulating layer, the base being made of metal and including a principal surface and a raised portion raised above the principal surface, the insulating layer covering the principal surface of the base and exposing at least a part of the raised portion;
an LED chip supported on the raised portion; and
a case including a reflective surface surrounding the LED chip,
wherein in an internal space surrounded by the reflective surface of the case are arranged said LED chip and at least one additional LED chip that emits light of a different wavelength from light emitted from said LED chip, and
wherein the additional LED chip is mounted at a position avoiding the raised portion.

16. The LED lighting module according to claim 15, further comprising a sealing resin collectively covering said LED chip and the additional LED chip, the sealing resin containing a fluorescent substance that emits light of a different wavelength from light emitted from said LED chip when excited by the light from said LED chip.

17. The LED lighting module according to claim 16, wherein said LED chip emits blue light, the additional LED chip emits red light, and the sealing resin emits green light when excited by the blue light emitted from said LED chip.

18. An LED lighting module comprising:
a substrate including a base and an insulating layer, the base being made of metal and including a principal surface and a raised portion raised above the principal surface, the insulating layer covering the principal surface of the base and exposing at least a part of the raised portion;
an LED chip supported on the raised portion; and
a case including a reflective surface surrounding the LED chip,
wherein the case includes two internal spaces surrounded by the reflective surface,
wherein the LED chip and the raised portion are arranged in one of the internal spaces, and
wherein at least one additional LED chip that emits light of a different wavelength from light emitted from the LED chip is arranged in the other one of the internal spaces.

19. The LED lighting module according to claim 18, further comprising a first sealing resin covering the LED chip and an additional sealing resin covering the additional LED chip,
wherein the first sealing resin contains a fluorescent substance that emits light of a different wavelength from light emitted from the LED chip when excited by the light from the LED chip.

20. The LED lighting module according to claim 19, wherein the LED chip emits blue light, the additional LED chip emits red light, the first sealing resin emits green light when excited by the blue light emitted from the LED chip, and the additional sealing resin is transparent.

21. An LED lighting module comprising:
a substrate including a base, an insulating layer and wiring, the base being made of metal and including a principal surface, the insulating layer covering the principal surface of the base, the wiring extending on the insulating layer;
a seat portion including an upper surface that is offset from the principal surface and the insulating layer of the substrate in a direction normal to the principal surface;
an LED chip supported on the upper surface of the seat portion;
a case including a reflective surface surrounding the LED chip;
a reflective resin covering the insulating layer, a side surface of the seat portion and the wiring, the reflective resin being configured to reflect light emitted from the LED chip; and
a sealing resin filled in the case and containing a fluorescent substance made of a sulfide, the fluorescent substance emitting light of a different wavelength from light emitted from the LED chip when excited by the light from the LED chip.

22. The LED lighting module according to claim 21, wherein the seat portion comprises a raised portion of the substrate raised above the principal surface,
at least a part of the raised portion is exposed from the insulating layer, and
the LED chip is supported on the raised portion.

23. The LED lighting module according to claim 21, wherein the reflective resin and the case comprise a bonding portion therebetween, and the bonding portion includes an extremity farthest away from the principal surface of the base, the extremity being farther away from the principal surface than any portion of the seat portion is.

24. The LED lighting module according to claim 21, wherein the reflective resin and the case comprise a bonding portion therebetween, and the bonding portion includes an extremity farthest away from the principal surface of the base, the extremity being farther away from the principal surface than any portion of the LED chip is.

25. A method of making an LED lighting module, the method comprising the steps of:
preparing a metal plate including a principal surface and a reverse surface facing away from each other in a thickness direction;
forming an insulating layer covering the principal surface;
forming a raised portion raised above the principal surface and a recessed portion recessed from the reverse surface by moving a part of the metal plate in a direction from the reverse surface toward the principal surface;
exposing at least a part of the raised portion by removing a part of the insulating layer; and
mounting the LED chip on the raised portion,
wherein the step of forming the raised portion and the recessed portion comprises forming a top surface in the raised portion such that the top surface is parallel to the principal surface, and
the step of exposing at least a part of the raised portion comprises preparing a removal tool with an edge extending along the top surface, and working the removal tool in such a manner that the edge moves along the top surface, thereby removing only a portion of the insulating layer which covers the top surface.

26. The method of making an LED lighting module according to claim 25, further comprising the step of forming a base plating layer covering the top surface, the forming of the base plating layer being performed after the step of exposing at least a part of the raised portion and before the step of mounting the LED chip on the raised portion.

27. The method of making an LED lighting module according to claim 26, further comprising the step of forming a base layer made of metal on the insulating layer after the step of forming the insulating layer,
   wherein in the step of forming the base plating layer, a wiring plating layer covering the base layer is formed collectively.

* * * * *